(12) United States Patent  
Kobayashi et al.

(10) Patent No.: US 12,057,501 B2
(45) Date of Patent: Aug. 6, 2024

(54) SEMICONDUCTOR DEVICE

(71) Applicant: KABUSHIKI KAISHA TOSHIBA, Tokyo (JP)

(72) Inventors: Yusuke Kobayashi, Yokohama (JP); Tomoaki Inokuchi, Yokohama (JP); Hiro Gangi, Ota (JP); Tatsunori Sakano, Shinagawa (JP); Yusuke Hayashi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 381 days.

(21) Appl. No.: 17/653,682

(22) Filed: Mar. 7, 2022

(65) Prior Publication Data
US 2023/0078116 A1 Mar. 16, 2023

(30) Foreign Application Priority Data

Sep. 16, 2021 (JP) .................. 2021-150896

(51) Int. Cl.
*H01L 23/00* (2006.01)
*H01L 29/40* (2006.01)
*H01L 29/78* (2006.01)
*H03K 17/56* (2006.01)

(52) U.S. Cl.
CPC ........ *H01L 29/7813* (2013.01); *H01L 29/404* (2013.01); *H01L 29/407* (2013.01); *H03K 17/56* (2013.01); *H03K 2217/0063* (2013.01); *H03K 2217/0072* (2013.01)

(58) Field of Classification Search
CPC .. H01L 29/7813; H01L 29/404; H01L 29/407
See application file for complete search history.

(56) References Cited

U.S. PATENT DOCUMENTS

| 2014/0027845 | A1 | 1/2014 | Kobayashi |
| 2018/0076318 | A1 | 3/2018 | Nishimura |
| 2019/0198660 | A1 | 6/2019 | Kachi |
| 2020/0388671 | A1 | 12/2020 | Takemoto et al. |

FOREIGN PATENT DOCUMENTS

| JP | 2004-22644 A | 1/2004 |
| JP | 2012-59943 A | 3/2012 |
| JP | 2014-027182 A | 2/2014 |
| JP | 2017-45827 A | 3/2017 |
| JP | 2018-046135 A | 3/2018 |
| JP | 2018-82202 A | 5/2018 |
| JP | 2019-114643 A | 7/2019 |
| JP | 2020-202271 A | 12/2020 |
| WO | WO 2017/168734 A1 | 10/2017 |
| WO | WO 2018/012122 A1 | 1/2018 |

*Primary Examiner* — Anthony Ho
(74) *Attorney, Agent, or Firm* — Oblon, McClelland, Maier & Neustadt, L.L.P.

(57) ABSTRACT

A semiconductor device of an embodiment includes: a semiconductor layer having a first face and a second face, the semiconductor layer including a first trench and a second trench on a side of a first face; a first electrode on the side of the first face; a second electrode on the side of the second face; a first gate electrode in the first trench; a first field plate electrode electrically connected to the first electrode in the first trench, a second gate electrode in the second trench; and a second field plate electrode electrically connected to the first electrode in the second trench, a resistance between first electrode and second field plate is different from a resistance between first electrode and the first field plate electrode.

13 Claims, 14 Drawing Sheets

COMPARATIVE EXAMPLE

EMBODIMENT

SEMICONDUCTOR DEVICE

CROSS-REFERENCE TO RELATED APPLICATION

This application is based upon and claims the benefit of priority from Japanese Patent Application No. 2021-150896, filed on Sep. 16, 2021, the entire contents of which are incorporated herein by reference.

FIELD

Embodiments described herein relate generally to a semiconductor device.

BACKGROUND

In order to miniaturize or improve the performance of the transistor, a vertical transistor in which a gate electrode is embedded in a trench is used. In the vertical transistor, the drain-source breakdown voltage (hereinafter, also simply referred to as "breakdown voltage") and the on-resistance are in a trade-off relationship. That is, when the impurity concentration in the drift region is increased in order to reduce the on-resistance, the breakdown voltage is reduced. Conversely, when the impurity concentration in the drift region is reduced in order to improve the breakdown voltage, the on-resistance increases.

As a method for improving the trade-off between the breakdown voltage and the on-resistance, there is a structure in which a field plate electrode is provided in a trench of a vertical transistor. By changing the electric field distribution in the drift region by the field plate electrode, it is possible to increase the impurity concentration in the drift region while maintaining the breakdown voltage, for example. Therefore, it is possible to reduce the on-resistance while maintaining the breakdown voltage.

For example, when a transistor is used for a switching device of a circuit including an inductive load such as an inverter circuit, a trade-off between a switching loss and a surge voltage becomes a problem. When the switching speed is increased in order to reduce the switching loss, the surge voltage generated in the body diode of the transistor increases. When the surge voltage generated in the body diode increases, for example, noise increases and/or reliability of the transistor decreases.

DETAILED DESCRIPTION

Figure 1:
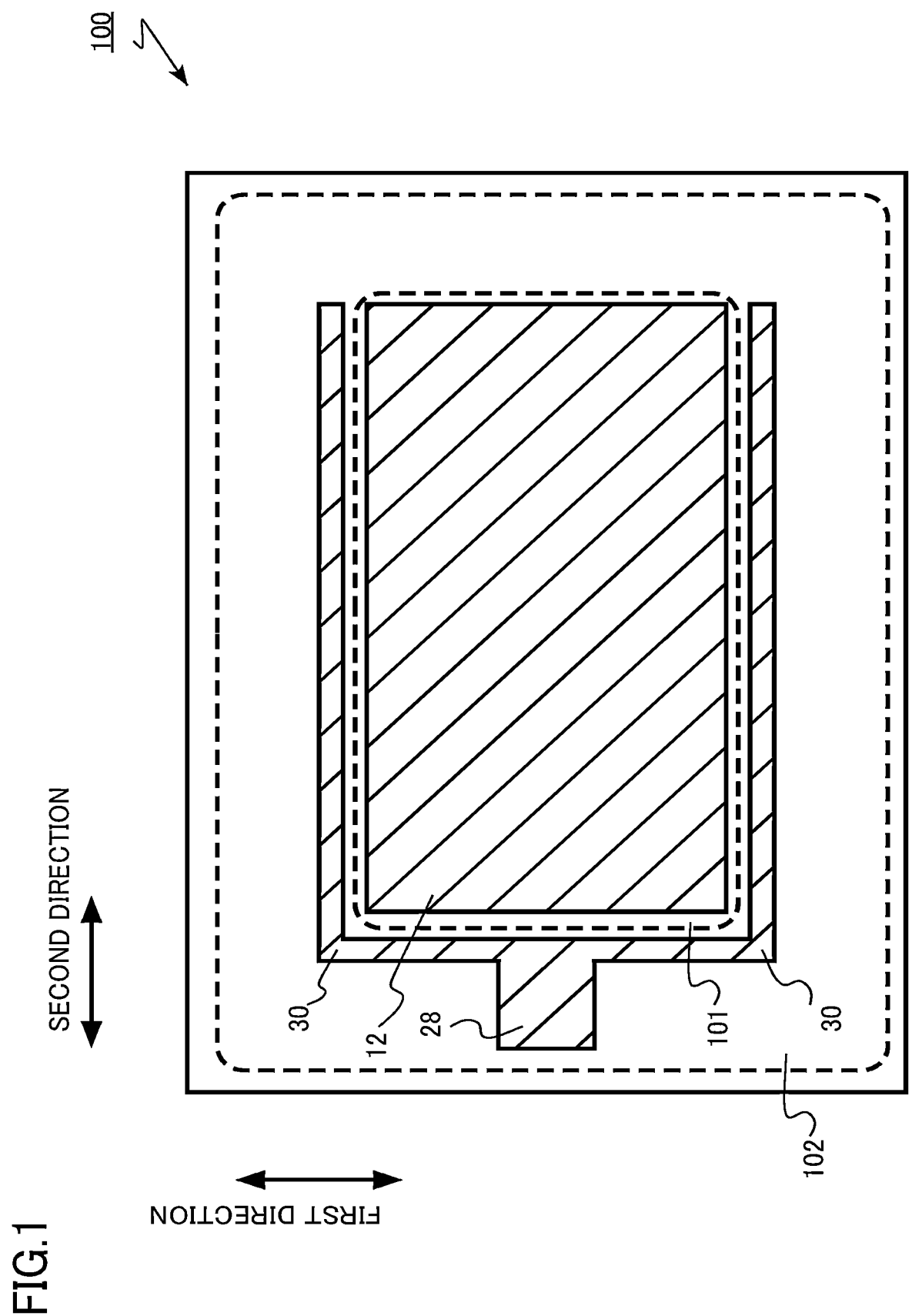
FIG. 1 is a schematic plan view of a semiconductor device of a first embodiment.

A semiconductor device of an embodiment includes a semiconductor layer including a first face and a second face opposing the first face, the semiconductor layer including a first trench disposed on a side of the first face and extending in a first direction parallel to the first face, a second trench disposed on a side of the first face and extending in the first direction, a first semiconductor region of a first conductivity type, a second semiconductor region of a second conductivity type disposed between the first semiconductor region and the first face, and a third semiconductor region of a first conductivity type disposed between the second semiconductor region and the first face; a first electrode disposed on a side of the first face of the semiconductor layer and electrically connected to the third semiconductor region; a second electrode disposed on a side of the second face of the semiconductor layer; a first gate electrode disposed in the first trench; a first field plate electrode disposed in the first trench, the first field plate electrode disposed between the first gate electrode and the second face, the first field plate electrode electrically connected to the first electrode, an electric resistance between the first electrode and the first field plate electrode is a first electric resistance; a second gate electrode disposed in the second trench; a second field plate electrode disposed in the second trench, the second field plate disposed between the second gate electrode and the second face, the second field plate electrically connected to the first electrode, an electric resistance between the first electrode and the second field plate electrode is a second electric resistance different from the first electric resistance; a first gate insulating layer disposed between the first gate electrode and the semiconductor layer; a first field plate insulating layer disposed between the first field plate electrode and the semiconductor layer; a second gate insulating layer disposed between the second gate electrode and the semiconductor layer; and a second field plate insulating layer disposed between the second field plate electrode and the semiconductor layer.

Embodiments of the present disclosure will be described below with reference to the drawings. In the following description, the same or similar members and the like are denoted by the same reference numerals, and the description of the members and the like once described is appropriately omitted.

In the following description, when notations of $n^+$, n, and $n^-$ and $p^+$, and $p^-$ are used, these notations represent relative levels of impurity concentration in each conductivity type. That is, $n^+$ indicates that $n^+$ is relatively higher than n in n type impurity concentration, and $n^-$ indicates that $n^-$ is relatively lower than n in n type impurity concentration. In addition, $p^+$ indicates that $p^+$ is relatively higher than p in p type impurity concentration, and $p^-$ indicates that $p^-$ is relatively lower than p in p type impurity concentration.

There is a case where the n+ type and the n− type are simply referred to as the n type, and the p+ type and the p− type are simply referred to as the p type.

The impurity concentration of the semiconductor device can be measured by, for example, secondary ion mass spectrometry (SIMS). The relative level of the impurity concentration of the semiconductor device can also be determined from the level of the carrier concentration obtained by scanning capacitance microscopy (SCM), for example. The distance such as the width and depth of the impurity region of the semiconductor device can be obtained by, for example, SIMS. The distance such as the width and depth of the impurity region of the semiconductor device can be obtained by, for example, the SCM image.

The depth of the trench, the thickness of the insulating layer, and the like of the semiconductor device can be measured on an image of SIMS or a transmission electron microscope (TEM), for example.

The electric resistance between members or a member itself of the semiconductor device can be obtained by direct measurement using a probe needle, for example. The electric resistance between the members can be obtained by, for example, performing identification of the material of a constituent between the members and identification of the shape of the constituent, and calculating from the electric resistivity of the identified material and the identified shape. The electric resistance of the member itself can be obtained by, for example, performing identification of the material of the member itself and identification of the shape of the member itself, and calculating from the electric resistivity of the identified material and the identified shape.

Identification of the material can be performed by energy-dispersive X-ray spectroscopy (EDX), for example. Identification of the shape can be performed by on a TEM image, for example.

First Embodiment

A semiconductor device of the first embodiment includes: a semiconductor layer including a first face and a second face opposing the first face, the semiconductor layer including a first trench disposed on a side of the first face and extending in a first direction parallel to the first face, a second trench disposed on a side of the first face and extending in the first direction, a first semiconductor region of a first conductivity type, a second semiconductor region of a second conductivity type disposed between the first semiconductor region and the first face, and a third semiconductor region of a first conductivity type disposed between the second semiconductor region and the first face; a first electrode disposed on a side of the first face of the semiconductor layer and electrically connected to the third semiconductor region, a second electrode disposed on a side of the second face of the semiconductor layer, a first gate electrode disposed in the first trench, a first field plate electrode disposed in the first trench, disposed between the first gate electrode and the second face, and electrically connected to the first electrode, the first field plate electrode whose electric resistance with the first electrode is a first electric resistance, a second gate electrode disposed in the second trench, a second field plate electrode disposed in the second trench, disposed between the second gate electrode and the second face, and electrically connected to the first electrode, the second field plate electrode whose electric resistance with the first electrode is a second electric resistance different from the first electric resistance, a first gate insulating layer disposed between the first gate electrode and the semiconductor layer, a first field plate insulating layer disposed between the first field plate electrode and the semiconductor layer, a second gate insulating layer disposed between the second gate electrode and the semiconductor layer, and a second field plate insulating layer disposed between the second field plate electrode and the semiconductor layer.

The semiconductor device of the first embodiment is a vertical transistor embedded with a gate electrode and a field plate electrode a trench. The semiconductor device of the first embodiment is a vertical power metal oxide semiconductor field effect transistor (MOSFET). The semiconductor device of the first embodiment is a MOSFET 100. The trench in the present description has a groove-shaped or recessed structure included in the semiconductor layer itself, the trench in which a configuration other than the semiconductor layer can be disposed.

Hereinafter, a case where the first conductivity type is the n type and the second conductivity type is the p type will be described as an example. That is, a case of the MOSFET of an n-channel type with electrons as carriers will be described as an example.

FIG. 1 is a schematic plan view of the semiconductor device of the first embodiment. The MOSFET 100 of the first embodiment has an active region 101 and a termination region 102. The active region 101 is surrounded by the termination region 102.

The active region 101 functions as a region through which a current flows when the MOSFET 100 is turned on. The active region 101 is provided with a transistor.

The termination region 102 functions as a region that relaxes the strength of the electric field applied to the end of the active region 101 when the MOSFET 100 is turned off, and improves the breakdown voltage of the MOSFET 100. The termination region 102 includes, for example, a RESURF structure or a guard ring structure.

Figure 2:
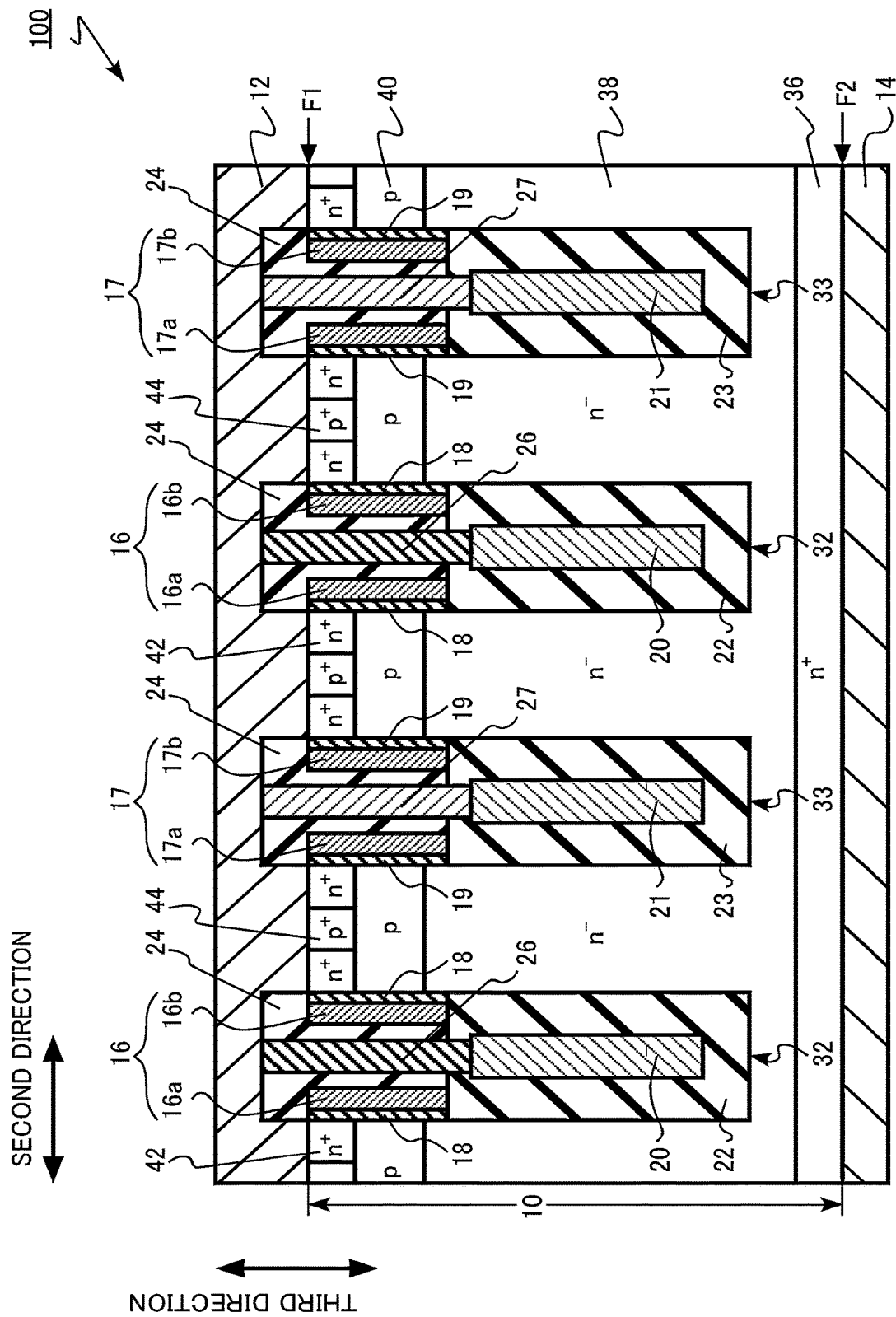
FIG. 2 is a schematic cross-sectional view of the semiconductor device of the first embodiment.

FIG. 2 is a schematic cross-sectional view of the semiconductor device of the first embodiment. FIG. 2 is a cross-sectional view of part of the active region 101 of the MOSFET 100.

Figure 3:
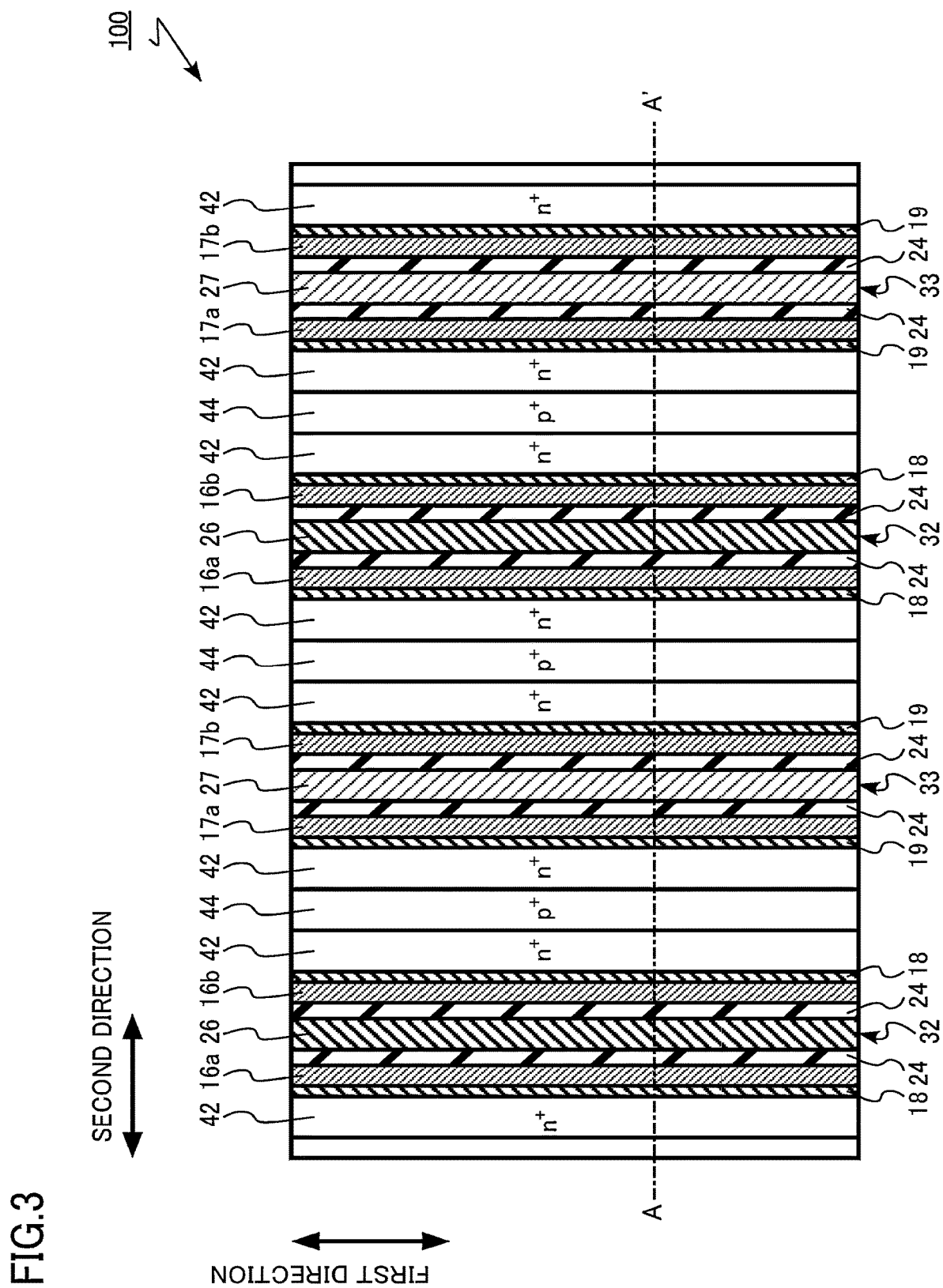
FIG. 3 is a schematic plan view of the semiconductor device of the first embodiment.

FIG. 3 is a schematic plan view of the semiconductor device of the first embodiment. FIG. 3 is a plan view of part of the active region 101 of the MOSFET 100. FIG. 3 is a plan view of a first face of FIG. 2 (F1 in FIG. 2). FIG. 2 is an AA' cross section of FIG. 3.

The MOSFET 100 includes a silicon layer 10 (semiconductor layer), a source electrode 12 (first electrode), a drain electrode 14 (second electrode), a first gate electrode 16, a second gate electrode 17, a first gate insulating layer 18, a second gate insulating layer 19, a first field plate electrode 20, a second field plate electrode 21, a first field plate insulating layer 22, a second field plate insulating layer 23, an interlayer insulating layer 24, a first connection 26, a second connection 27, a gate electrode pad 28, and a gate wire 30.

The first gate electrode 16 has a first part 16a and a second part 16b. The second gate electrode has a third part 17a and a fourth part 17b.

The silicon layer 10 includes a first trench 32, a second trench 33, a drain region 36 of an n+ type, a drift region 38 (first semiconductor region) of an n− type, a body region 40 (second semiconductor region) of a p type, a source region 42 (third semiconductor region) of an n¹ type, and a contact region 44 of a p+ type.

The silicon layer 10 is an example of the semiconductor layer. The source electrode 12 is an example of the first electrode. The drain electrode 14 is an example of the second electrode.

The drift region 38 is an example of the first semiconductor region. The body region 40 is an example of the second semiconductor region. The source region 42 is an example of the third semiconductor region.

The silicon layer 10 is disposed between the source electrode 12 and the drain electrode 14. The silicon layer 10 includes a first face ("F1" in FIG. 2) and a second face ("F2" in FIG. 2). A second face F2 opposes the first face F1.

The first direction and the second direction are directions parallel to the first face F1. The second direction is a direction intersecting the first direction. The second direction is a direction perpendicular to the first direction. A third direction is a direction perpendicular to the first face F1. The third direction is a direction perpendicular to the first direction and the second direction.

Hereinafter, "depth" means a depth based on the first face F1. That is, "depth" means a distance in the third direction based on the first face F1.

The silicon layer 10 is single crystal silicon (Si). The surface of the silicon layer 10 is a face inclined at equal to or more than 0° and equal to or less than 8° with respect to a (100) face, for example.

The drain region 36 of the n$^+$ type is provided in the silicon layer 10. The drain region 36 contains an n type impurity. The n type impurity is, for example, phosphorus (P) or arsenic (As). The concentration of the n type impurity is, for example, equal to or more than $1 \times 10^{18}$ cm$^{-3}$ and equal to or less than $1 \times 10^{21}$ cm$^{-3}$.

The drift region 38 of the n$^-$ type is provided in the silicon layer 10. The drift region 38 is provided between the drain region 36 and the first face F1. The drift region 38 is provided on the drain region 36.

The drift region 38 contains an n type impurity. The n type impurity is, for example, phosphorus (P) or arsenic (As). The n type impurity concentration is, for example, equal to or more than $1 \times 10^{15}$ cm$^{-3}$ and equal to or less than $1 \times 10^{10}$ cm$^{-3}$. The drift region 38 is, for example, an epitaxial growth layer formed by epitaxial growth on the drain region 36 of the n$^+$ type.

The thickness of the drift region 38 in the third direction is, for example, equal to or more than 7 μm and equal to or less than 15 μm.

The body region 40 of the p type is provided in the silicon layer 10. The body region 40 is provided between the drift region 38 and the first face F1. When the MOSFET 100 is turned on, a channel is formed in a region in contact with the first gate insulating layer 18.

The body region 40 contains a p type impurity. The p type impurity is, for example, boron (B). The p type impurity concentration is, for example, equal to or more than $1 \times 10^{16}$ cm$^{-3}$ and equal to or less than $1 \times 10^{18}$ cm$^{-3}$.

The source region 42 of the n$^+$ type is provided in the silicon layer 10. The source region 42 is provided between the body region 40 and the first face F1.

The source region 42 contains an n type impurity. The n type impurity is, for example, phosphorus (P) or arsenic (As). The n type impurity concentration is, for example, equal to or more than $1 \times 10^{19}$ cm$^{-3}$ and equal to or less than $1 \times 10^{21}$ cm$^{-3}$.

The contact region 44 of the p$^+$ type is provided in the silicon layer 10. The contact region 44 is provided between the body region 40 and the first face F1.

The contact region 44 contains a p type impurity. The p type impurity is, for example, boron (B). The p type impurity concentration is, for example, equal to or more than $1 \times 10^{19}$ cm$^{-3}$ and equal to or less than $1 \times 10^{21}$ cm$^{-3}$. The p type impurity concentration of the contact region 44 is higher than the p type impurity concentration of the body region 40.

The first trench 32 is present in the silicon layer 10. The first trench 32 is disposed on the side of the first face F1 of the silicon layer 10. The first trench 32 is a groove formed in the silicon layer 10.

The first trench 32 penetrates the body region 40 and reaches the drift region 38. The depth of the first trench 32 is, for example, equal to or more than 4 μm and equal to or less than 6 μm.

The second trench 33 is present in the silicon layer 10. The second trench 33 is disposed on the side of the first face F1 of the silicon layer 10. The second trench 33 is a groove formed in the silicon layer 10.

The second trench 33 penetrates the body region 40 and reaches the drift region 38. The depth of the second trench 33 is, for example, equal to or more than 4 μm and equal to or less than 6 μm.

As illustrated in FIG. 3, the first trench 32 and the second trench 33 extend in the first direction on the first face F1. The first trench 32 and the second trench 33 are repeatedly disposed at a constant pitch in the second direction.

The first gate electrode 16 is provided in the first trench 32. The first gate electrode 16 is, for example, polycrystalline silicon containing the n type impurity or the p type impurity.

The first gate electrode 16 has the first part 16a and the second part 16b. The first part 16a and the second part 16b are separated in the second direction. The first gate electrode 16 is divided into the first part 16a and the second part 16b.

The second gate electrode 17 is provided in the second trench 33. The second gate electrode 17 is, for example, polycrystalline silicon containing the n type impurity or the p type impurity.

The second gate electrode 17 has the third part 17a and the fourth part 17b. The third part 17a and the fourth part 17b are separated in the second direction. The second gate electrode 17 is divided into the third part 17a and the fourth part 17b.

The first gate insulating layer 18 is provided between the first gate electrode 16 and the silicon layer 10. The first gate insulating layer 18 is provided between the first gate electrode 16 and the body region 40. The first gate insulating layer 18 is provided between the first gate electrode 16 and the drift region 38. The first gate insulating layer 18 is provided between the first gate electrode 16 and the source region 42. The first gate insulating layer 18 is, for example, a silicon oxide.

The second gate insulating layer 19 is provided between the second gate electrode 17 and the silicon layer 10. The second gate insulating layer 19 is provided between the second gate electrode 17 and the body region 40. The second gate insulating layer 19 is provided between the second gate electrode 17 and the drift region 38. The second gate insulating layer 19 is provided between the second gate electrode 17 and the source region 42. The second gate electrode 17 is, for example, a silicon oxide.

The first field plate electrode 20 is provided in the first trench 32. The first field plate electrode 20 is provided between the first gate electrode 16 and the second face F2 in the third direction. The first field plate electrode 20 extends in the first direction.

The first field plate electrode 20 has a function of changing the electric field distribution in the drift region 38 when the MOSFET 100 is turned off, and improving the breakdown voltage of the MOSFET 100.

The first field plate electrode 20 is electrically connected to the source electrode 12. Hereinafter, the electric resistance between the source electrode 12 and the first field plate electrode 20 is referred to as the first electric resistance. Hereinafter, the electric resistance value between the source electrode 12 and the first field plate electrode 20 is referred to as the first electric resistance.

The first field plate electrode 20 is a conductor. The first field plate electrode 20 is, for example, polycrystalline silicon containing the n type impurity or the p type impurity.

The second field plate electrode 21 is provided in the second trench 33. The second field plate electrode 21 is provided between the second gate electrode 17 and the second face F2 in the third direction. The second field plate electrode 21 extends in the first direction.

The second field plate electrode 21 has a function of changing the electric field distribution in the drift region 38 when the MOSFET 100 is turned off, and improving the breakdown voltage of the MOSFET 100.

The second field plate electrode 21 is electrically connected to the source electrode 12. Hereinafter, the electric resistance between the source electrode 12 and the second field plate electrode 21 is referred to as the second electric resistance. Hereinafter, the electric resistance value between the source electrode 12 and the second field plate electrode 21 is referred to as the second electric resistance.

The second electric resistance is different from the first electric resistance. The electric resistance value between the source electrode 12 and the second field plate electrode 21 is different from the electric resistance value between the source electrode 12 and the first field plate electrode 20.

The value of the first electric resistance and the value of the second electric resistance are different, for example, by equal to or more than one digit. For example, the second electric resistance is equal to or more than 10 times the first electric resistance. For example, the first electric resistance is equal to or more than 10 times the second electric resistance.

The second field plate electrode 21 is a conductor. The second field plate electrode 21 is, for example, polycrystalline silicon containing the n type impurity or the p type impurity. The second field plate electrode 21 is formed of, for example, the same material as that of the first field plate electrode 20.

The first field plate insulating layer 22 is provided between the first field plate electrode 20 and the silicon layer 10. The first field plate insulating layer 22 is provided between the first field plate electrode 20 and the drift region 38. The first field plate insulating layer 22 is, for example, a silicon oxide.

The thickness of the first field plate insulating layer 22 is thicker than the thickness of the first gate insulating layer 18, for example. The thickness of the first field plate insulating layer 22 is, for example, equal to or more than 5 times and equal to or less than 30 times the thickness of the first gate insulating layer 18.

The second field plate insulating layer 23 is provided between the second field plate electrode 21 and the silicon layer 10. The second field plate insulating layer 23 is provided between the second field plate electrode 21 and the drift region 38. The second field plate insulating layer 23 is, for example, a silicon oxide.

The thickness of the second field plate insulating layer 23 is larger than the thickness of the second gate insulating layer 19, for example. The thickness of the second field plate insulating layer 23 is, for example, equal to or more than 5 times and equal to or less than 30 times the thickness of the second gate insulating layer 19.

The first connection 26 is provided between the source electrode 12 and the first field plate electrode 20. At least a part of the first connection 26 is provided in the first trench 32. The first connection 26 is provided between the first part 16a and the second part 16b of the first gate electrode 16. The first connection 26 electrically connects the source electrode 12 and the first field plate electrode 20.

The electric resistance value of the first connection 26 is, for example, the first electric resistance.

The first connection 26 is a conductor. The first connection 26 is, for example, metal, a metal nitride, metal carbide, a metal semiconductor compound, or a semiconductor.

The first connection 26 contains, for example, tungsten (W), aluminum (Al), titanium (Ti), tantalum (Ta), copper (Cu), or silicon (Si).

The first connection 26 is, for example, tungsten (W), aluminum (Al), titanium (Ti), a titanium nitride, or polycrystalline silicon.

The first connection 26 is made of, for example, a material different from that of the source electrode 12. The electric resistivity of the material of the first connection 26 is different from, for example, the electric resistivity of the material of the source electrode 12.

The first connection 26 is made of, for example, the same material as that of the source electrode 12.

The first connection 26 is made of, for example, a material different from that of the first field plate electrode 20. The electric resistivity of the material of the first connection 26 is different from, for example, the electric resistivity of the material of the first field plate electrode 20.

The first connection 26 is made of, for example, the same material as that of the first field plate electrode 20.

The second connection 27 is provided between the source electrode 12 and the second field plate electrode 21. At least a part of the second connection 27 is provided in the second trench 33. The second connection 27 is provided in the second gate electrode 17 between the third part 17a and the fourth part 17b. The second connection 27 electrically connects the source electrode 12 and the second field plate electrode 21.

The electric resistance of the second connection 27 is different from the electric resistance of the first connection 26. The electric resistance value of the second connection 27 is, for example, the second electric resistance. The second electric resistance is different from the first electric resistance.

The value of the electric resistance of the first connection 26 and the value of the electric resistance of the second connection 27 are different, for example, by equal to or more than one digit. For example, the electric resistance of the second connection 27 is equal to or more than 10 times the electric resistance of the first connection 26. For example, the electric resistance of the first connection 26 is equal to or more than 10 times the electric resistance of the second connection 27.

The second connection 27 is a conductor. The second connection 27 is, for example, metal, a metal nitride, metal carbide, a metal semiconductor compound, or a semiconductor.

The second connection 27 contains, for example, tungsten (W), aluminum (Al), titanium (Ti), tantalum (Ta), copper (Cu), or silicon (Si).

The second connection 27 is, for example, tungsten (W), aluminum (Al), titanium (Ti), a titanium nitride, or polycrystalline silicon.

The second connection 27 is made of, for example, a material different from that of the source electrode 12. The electric resistivity of the material of the second connection 27 is different from, for example, the electric resistivity of the material of the source electrode 12.

The second connection 27 is made of, for example, the same material as that of the source electrode 12.

The second connection 27 is made of, for example, a material different from that of the second field plate electrode 21. The electric resistivity of the material of the second connection 27 is different from, for example, the electric resistivity of the material of the second field plate electrode 21.

The second connection 27 is made of, for example, the same material as that of the second field plate electrode 21.

The second connection 27 is made of, for example, a material different from that of the first connection 26. The electric resistivity of the material of the second connection 27 is different from, for example, the electric resistivity of the material of the first connection 26.

The second connection 27 is made of, for example, the same material as that of the first connection 26. For example, even if the material of the first connection 26 and the material of the second connection 27 are the same, the electric resistance of the second connection 27 can be made different from the electric resistance of the first connection 26 by changing the shape.

For example, the material of the first connection 26 is polycrystalline silicon, and the material of the second connection 27 is tungsten having a lower electric resistivity than that of polycrystalline silicon. This combination allows the electric resistance of the second connection 27 to be lower than the electric resistance of the first connection 26. Therefore, the second electric resistance can be made lower than the first electric resistance.

For example, the material of the first connection 26 is aluminum, and the material of the second connection 27 is tungsten having a higher electric resistivity than that of aluminum. This combination allows the electric resistance of the second connection 27 to be higher than the electric resistance of the first connection 26. Therefore, the second electric resistance can be made higher than the first electric resistance.

The first connection 26 or the second connection 27 may be a part of the source electrode 12 formed simultaneously with the source electrode 12.

The interlayer insulating layer 24 is provided between the first gate electrode 16 and the first connection 26. The interlayer insulating layer 24 is provided between the first gate electrode 16 and the source electrode 12. The interlayer insulating layer 24 has a function of electrically separating the first gate electrode 16 from the first connection 26, and the first gate electrode 16 from the source electrode 12.

The interlayer insulating layer 24 is provided between the second gate electrode 17 and the second connection 27. The interlayer insulating layer 24 is provided between the second gate electrode 17 and the source electrode 12. The interlayer insulating layer 24 has a function of electrically separating the second gate electrode 17 from the second connection 27, and the second gate electrode 17 from the source electrode 12.

The interlayer insulating layer 24 is, for example, a silicon oxide.

The source electrode 12 is provided on the side of the first face F1 of the silicon layer 10. The source electrode 12 is provided on the first face F1 of the silicon layer 10.

As illustrated in FIG. 1, the source electrode 12 is provided in the active region 101 of the MOSFET 100. The source electrode 12 is electrically connected to the source region 42 and the body region 40. The source electrode 12 is in contact with the source region 42, for example.

The source electrode 12 is electrically connected to the first field plate electrode 20 by using the first connection 26. The source electrode 12 is electrically connected to the second field plate electrode 21 by using the second connection 27.

The source electrode 12 becomes a region to which, for example, a bonding wire is connected when the MOSFET 100 is mounted.

The source electrode 12 is a metal electrode. The source electrode 12 has a stacked structure of titanium (Ti) and aluminum (Al), for example.

The drain electrode 14 is provided on the side of the second face F2 of the silicon layer 10. The drain electrode 14 is provided on the second face F2 of the silicon layer 10. The drain electrode 14 is electrically connected to the drain region 36. The drain electrode 14 is in contact with the drain region 36.

The drain electrode 14 is a metal electrode. The drain electrode 14 has a stacked structure of a material selected from titanium (Ti), aluminum (Al), nickel (Ni), copper (Cu), silver (Ag), and gold (Au), for example.

The gate electrode pad 28 is provided on the side of the first face F1 of the silicon layer 10. The gate electrode pad 28 is provided on the first face F1 of the silicon layer 10.

The gate electrode pad 28 is provided in the termination region of the MOSFET 100 as illustrated in FIG. 1. The gate electrode pad 28 is electrically connected to the first gate electrode 16 and the second gate electrode 17. The gate electrode pad 28 becomes a region to which, for example, a bonding wire is connected when the MOSFET 100 is mounted.

The gate electrode pad 28 is a metal electrode.

The gate electrode pad 28 has a stacked structure of titanium (Ti) and aluminum (Al), for example. The material of the gate electrode pad 28 is the same as the material of the source electrode 12, for example.

The gate wire 30 is provided in the termination region of the MOSFET 100 as illustrated in FIG. 1. The gate wire 30 is electrically connected to the first gate electrode 16 and the second gate electrode 17. The gate electrode pad 28 is electrically connected to the first gate electrode 16 and the second gate electrode 17 by using the gate wire 30.

The gate wire 30 is a metal electrode. The gate wire 30 has a stacked structure of titanium (Ti) and aluminum (Al), for example. The material of the gate wire 30 is the same as the material of the source electrode 12 and the material of the gate electrode pad 28, for example.

Hereinafter, functions and effects of the semiconductor device of the first embodiment will be described.

For example, when a transistor is used for a switching device of a circuit including an inductive load such as an inverter circuit, a trade-off between a switching loss and a surge voltage becomes a problem. When the switching speed is increased in order to reduce the switching loss, the surge voltage generated in the body diode of the transistor increases. When the surge voltage increases, for example, noise increases and/or reliability of the transistor decreases.

Therefore, it is desired to achieve a transistor that can improve the trade-off between the switching loss and the surge voltage.

Figure 4:
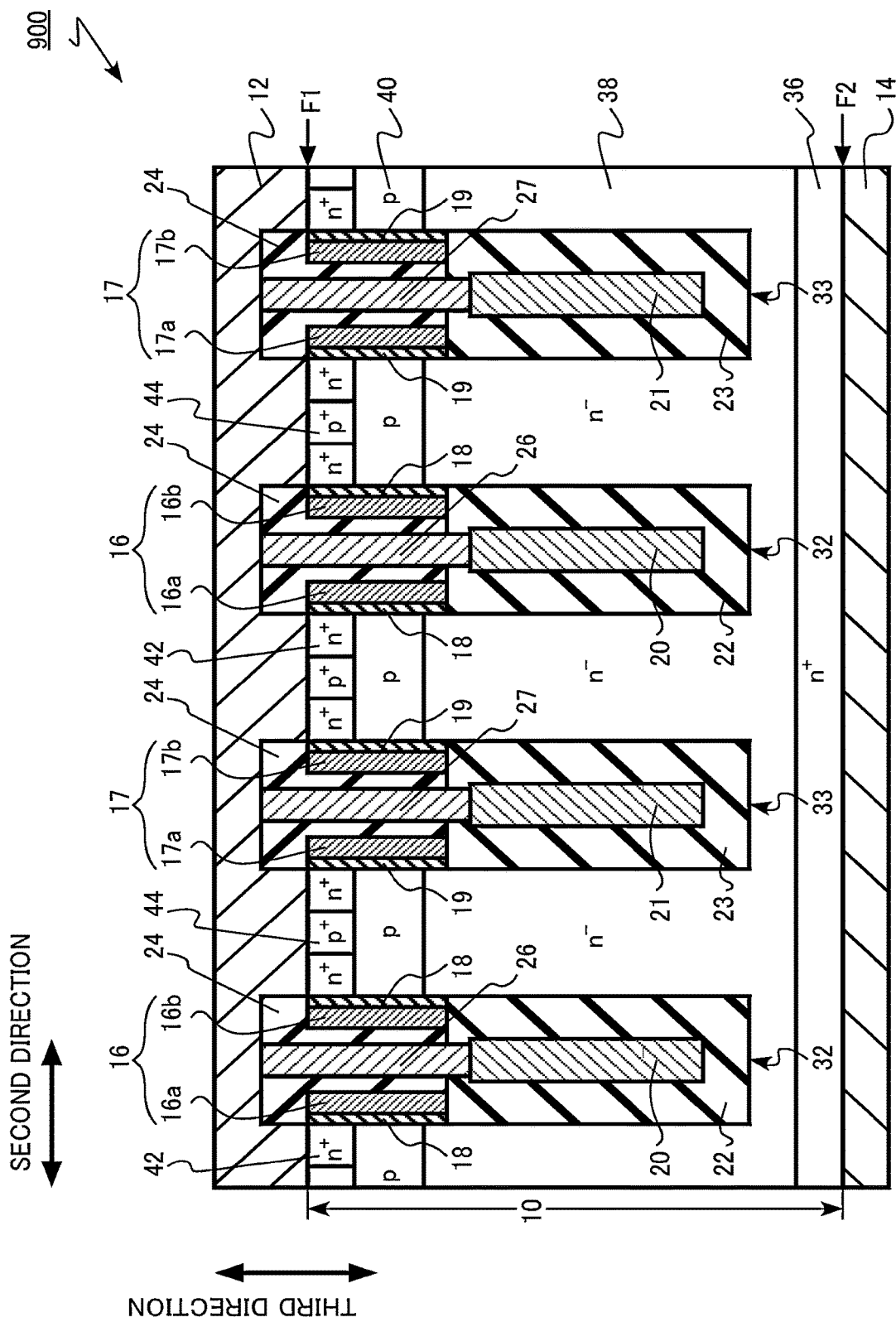
FIG. 4 is a schematic cross-sectional view of a semiconductor device of a comparative example.

FIG. 4 is a schematic cross-sectional view of the semiconductor device of the comparative example. The semiconductor device of the comparative example is a vertical transistor embedded with a gate electrode and a field plate electrode a trench. The semiconductor device of the comparative example is a MOSFET 900. FIG. 4 is a view corresponding to FIG. 2 of the first embodiment.

The MOSFET 900 is different from the MOSFET 100 of the first embodiment in that a first electric resistance between the source electrode 12 and the first field plate electrode 20 and a second electric resistance between the source electrode 12 and the second field plate electrode 21 are the same. The MOSFET 900 is different from the MOSFET 100 of the first embodiment in that the electric resistance of the first connection 26 and the electric resistance of the second connection 27 are the same.

In the MOSFET 900, the first connection 26 and the second connection 27 are made of the same material. The first connection 26 and the second connection 27 have the same shape. Therefore, the electric resistance of the first connection 26 and the electric resistance of the second connection 27 are the same.

In the MOSFET 900, the first electric resistance between the source electrode 12 and the first field plate electrode 20 and the second electric resistance between the source electrode 12 and the second field plate electrode 21 are the same.

Figure 5:
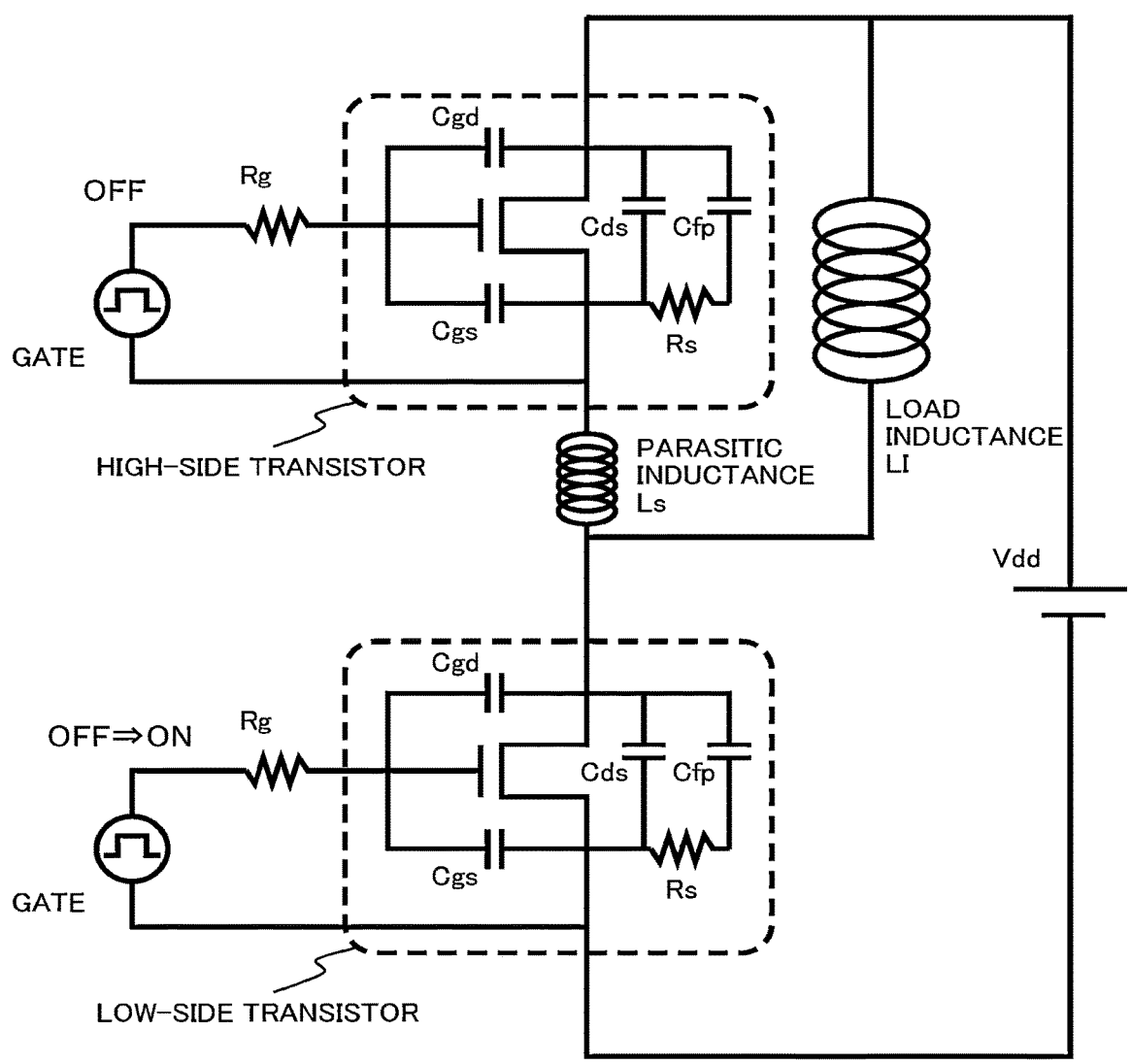
FIG. 5 is an explanatory diagram of functions and effects of the semiconductor device of the first embodiment.

FIG. 5 is an explanatory diagram of functions and effects of the semiconductor device of the first embodiment. FIG. 5 is a circuit diagram of a chopper circuit used in simulation of the switching loss and the surge voltage.

As illustrated in FIG. 5, the chopper circuit includes a high-side transistor, a low-side transistor, a load inductance, and a parasitic inductance.

For example, it is assumed that the high-side transistor is in an off state and a reflux current caused by the load inductance flows through the body diode of the high-side transistor. In this state, the low-side transistor is changed from the off state to the on state.

By changing the low-side transistor from the off state to the on state, the body diode of the high-side transistor is switched to the reverse bias, and a so-called reverse recovery operation starts. At the time of the reverse recovery operation, a high surge voltage is generated in the body diode due to the parasitic inductance.

Figure 6A:
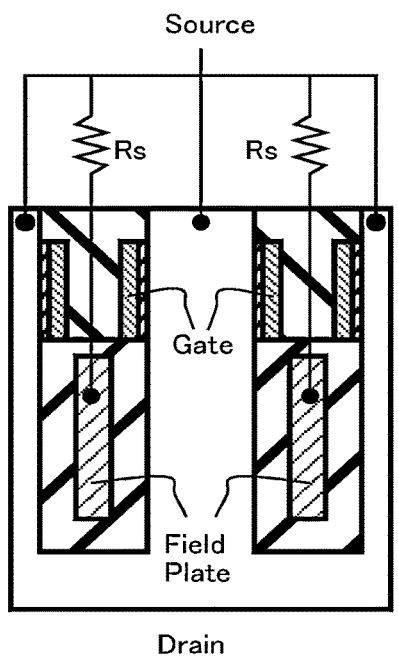
FIGS. 6A and 6B are explanatory diagrams of functions and effects of the semiconductor device of the first embodiment.
Figure 6B:
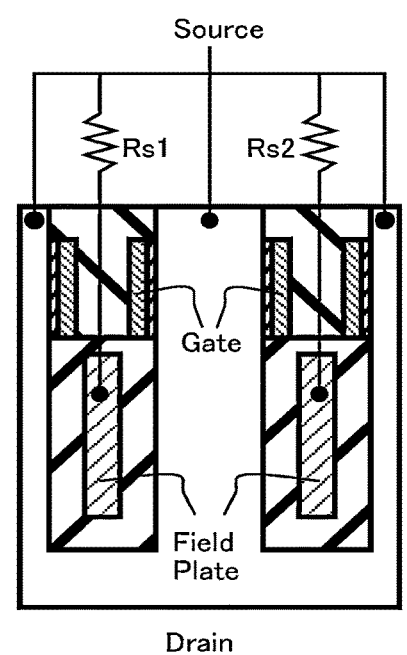

FIGS. 6A and 6B are explanatory diagrams of functions and effects of the semiconductor device of the first embodiment. FIG. 6 is a view illustrating a transistor structure used for simulating the switching loss and the surge voltage. The transistor having the structure illustrated in FIG. 6 was applied to the high-side transistor and the low-side transistor of FIG. 5 to simulate switching loss and surge voltage.

The transistor structure of FIG. 6A corresponds to the transistor structure of the MOSFET 900 of the comparative example. In the transistor structure of FIG. 6A, an electric resistance Rs between the source and the field plate is fixed to the same value between two adjacent transistors.

The transistor structure of FIG. 6B corresponds to the transistor structure of the MOSFET 100 of the first embodiment. In the transistor structure of FIG. 6B, the electric resistance between the source and the field plate is variable between two adjacent transistors. In the transistor structure of FIG. 6B, a first electric resistance Rs1 and a second electric resistance Rs2 are parameters that can be independently changed.

Figure 7:
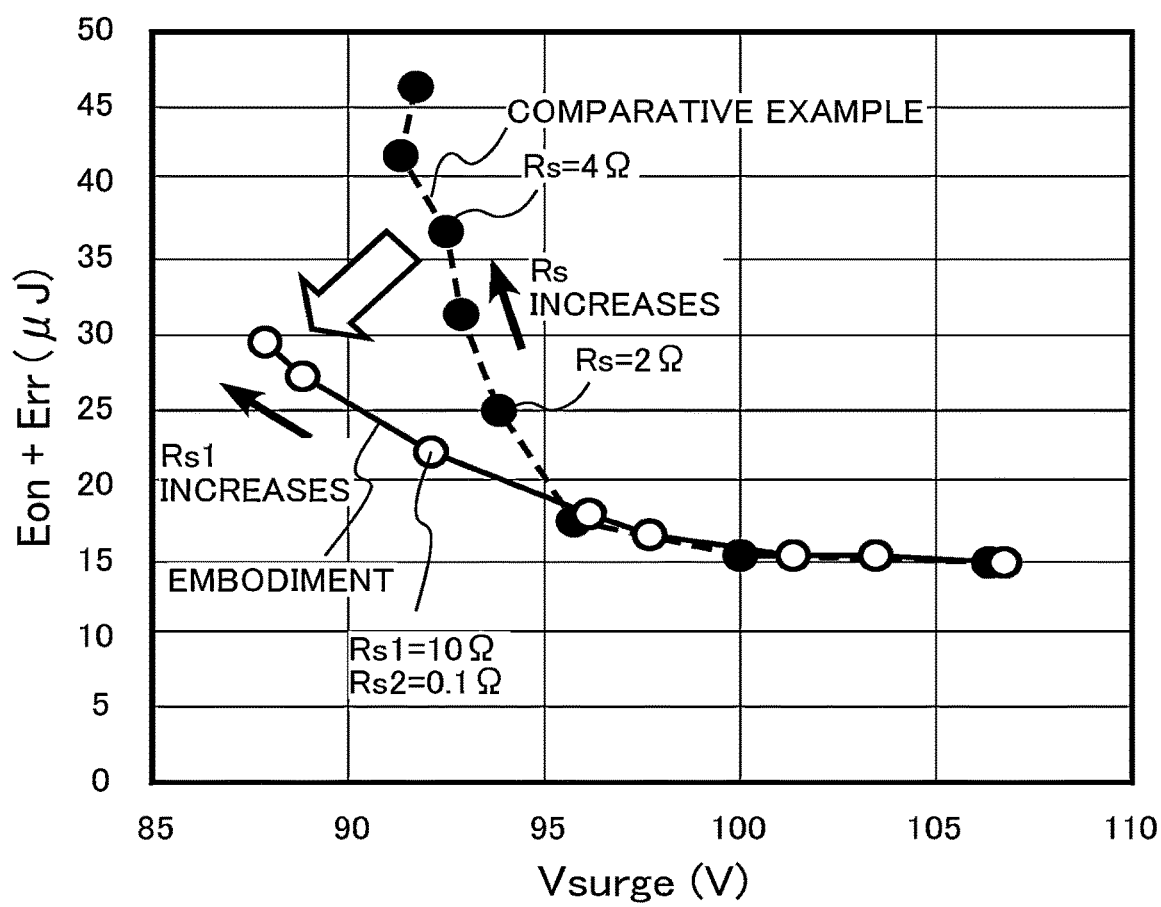
FIG. 7 is an explanatory diagram of functions and effects of the semiconductor device of the first embodiment.

FIG. 7 is an explanatory diagram of functions and effects of the semiconductor device of the first embodiment. FIG. 7 is a view illustrating a simulation result of the switching loss and the surge voltage.

The horizontal axis represents the surge voltage, and the vertical axis represents the switching loss. The switching loss is a sum of a turn-on loss (Eon) and a reverse recovery loss (Err).

In the case of the transistor structure of the comparative example, the switching loss and the surge voltage were calculated by changing the electric resistance Rs. In the case of the transistor structure of the embodiment, the switching loss and the surge voltage were calculated by changing the first electric resistance Rs1 with the second electric resistance Rs2 fixed to 0.1Ω.

In the transistor including the field plate, an electric resistance between the source and the field plate and a capacitance of the field plate function as a parasitic snubber circuit. Therefore, the surge voltage generated in the body diode of the transistor can be reduced by increasing the electric resistance between the source and the field plate. However, when the electric resistance between the source and the field plate is increased, the switching loss increases, and a trade-off between the switching loss and the surge voltage occurs as illustrated in FIG. 7.

As illustrated in FIG. 7, it has been found that the trade-off between the switching loss and the surge voltage is improved by setting the first electric resistance Rs1 and the second electric resistance Rs2 to different values as in the transistor structure of the embodiment.

In particular, in a region where the first electric resistance Rs1 increases and the difference between the first electric resistance Rs1 and the second electric resistance Rs2 increases, the trade-off between the switching loss and the surge voltage is significantly improved.

In the MOSFET 100 of the first embodiment, the second electric resistance between the source electrode 12 and the second field plate electrode 21 is different from the first electric resistance between the source electrode 12 and the first field plate electrode 20. Therefore, according to the MOSFET 100 of the first embodiment, it is possible to improve the trade-off between the switching loss and the surge voltage.

In the MOSFET 100 of the first embodiment, from the viewpoint of improving the trade-off between the switching loss and the surge voltage, the value of the first electric resistance and the value of the second electric resistance are preferably different by equal to or more than one digit, and more preferably different by equal to or more than two digits. For example, the first electric resistance is preferably equal to or more than 10 times, more preferably equal to or more than 50 times, and yet more preferably equal to or more than 100 times the second electric resistance. For example, the second electric resistance is preferably equal to or more than 10 times, more preferably equal to or more than 50 times, and yet more preferably equal to or more than 100 times the first electric resistance.

In the MOSFET 100 of the first embodiment, from the viewpoint of improving the trade-off between the switching loss and the surge voltage, the value of the electric resistance of the first connection 26 and the value of the electric resistance of the second connection 27 are preferably different by equal to or more than one digit, and more preferably different by equal to or more than two digits. For example, the electric resistance of the second connection 27 is preferably equal to or more than 10 times, more preferably equal to or more than 50 times, and yet more preferably equal to or more than 100 times the electric resistance of the first connection 26. For example, the electric resistance of the first connection 26 is preferably equal to or more than 10 times, more preferably equal to or more than 50 times, and yet more preferably equal to or more than 100 times the electric resistance of the second connection 27.

As described above, according to the first embodiment, it is possible to achieve a MOSFET that can improve the trade-off between the switching loss and the surge voltage.

Second Embodiment

A semiconductor device of the second embodiment is different from the semiconductor device of the first embodiment in further including: a first wire extending in a direction intersecting the first trench and electrically connected between the first field plate electrode and the first electrode; and a second wire extending in a direction intersecting the second trench and electrically connected between the second field plate electrode and the first electrode. Hereinafter, part of description of the contents overlapping the first embodiment may be omitted.

The semiconductor device of the second embodiment is a vertical transistor embedded with a gate electrode and a field plate electrode a trench. The semiconductor device of the second embodiment is a vertical power MOSFET. The semiconductor device of the second embodiment is a MOSFET 200.

Figure 8:
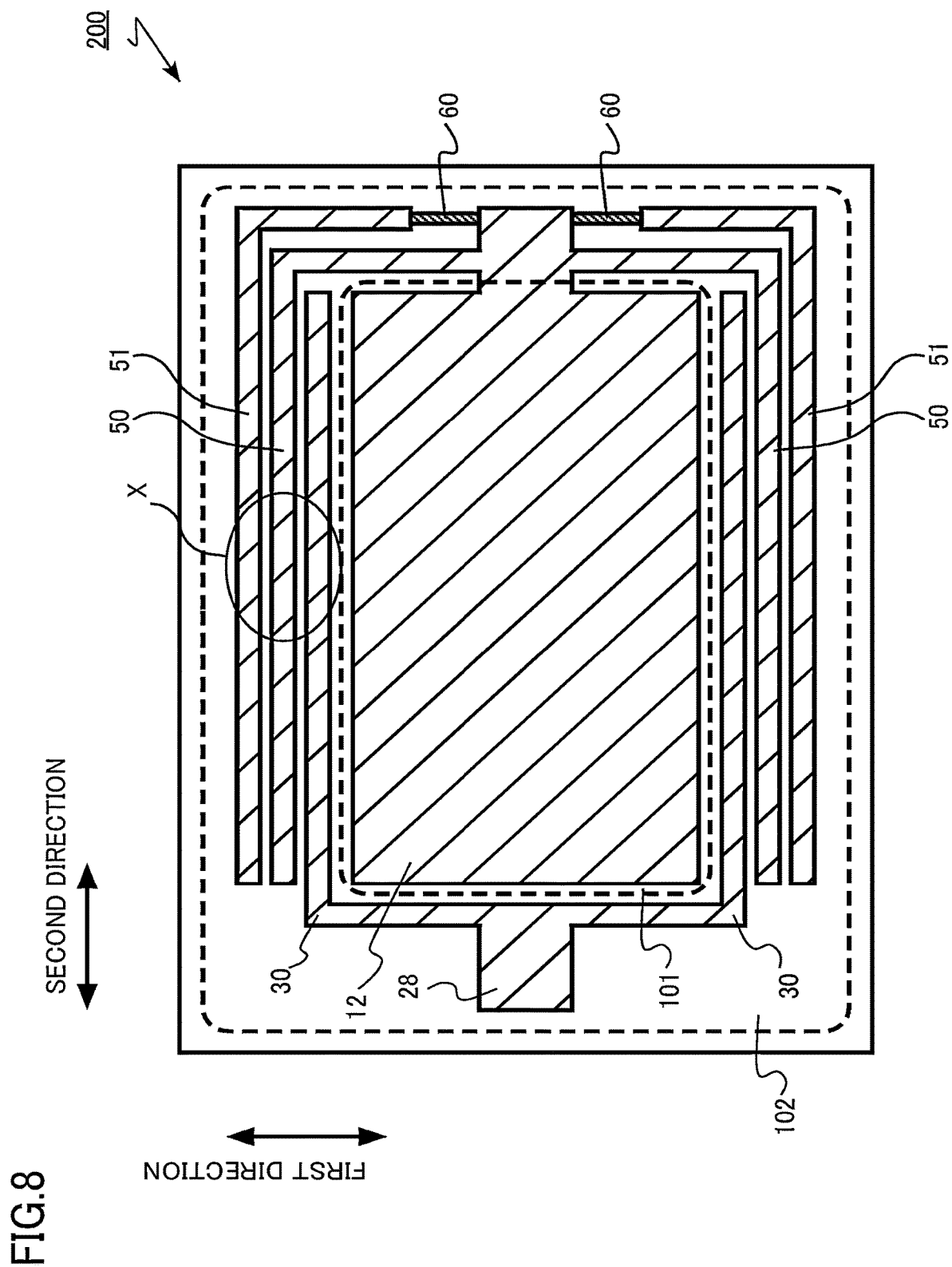
FIG. 8 is a schematic plan view of a semiconductor device of a second embodiment.

FIG. 8 is a schematic plan view of the semiconductor device of the second embodiment. FIG. 8 is a view corresponding to FIG. 1 of the MOSFET 100 of the first embodiment.

Figure 9:
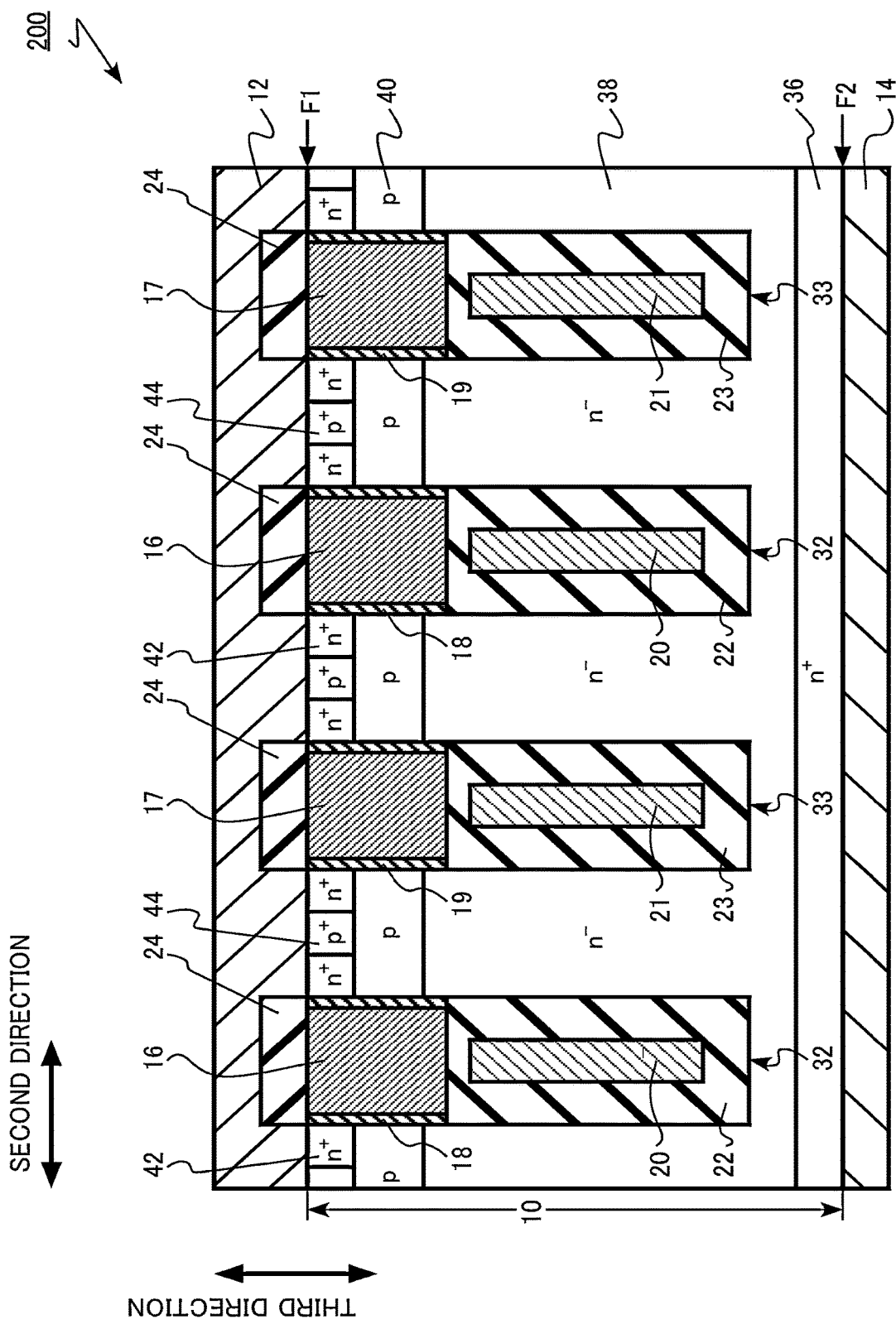
FIG. 9 is a schematic cross-sectional view of the semiconductor device of the second embodiment.

FIG. 9 is a schematic cross-sectional view of the semiconductor device of the second embodiment. FIG. 9 is a cross-sectional view of part of the active region 101 of the MOSFET 200. FIG. 9 is a view corresponding to FIG. 2 of the MOSFET 100 of the first embodiment.

Figure 10:
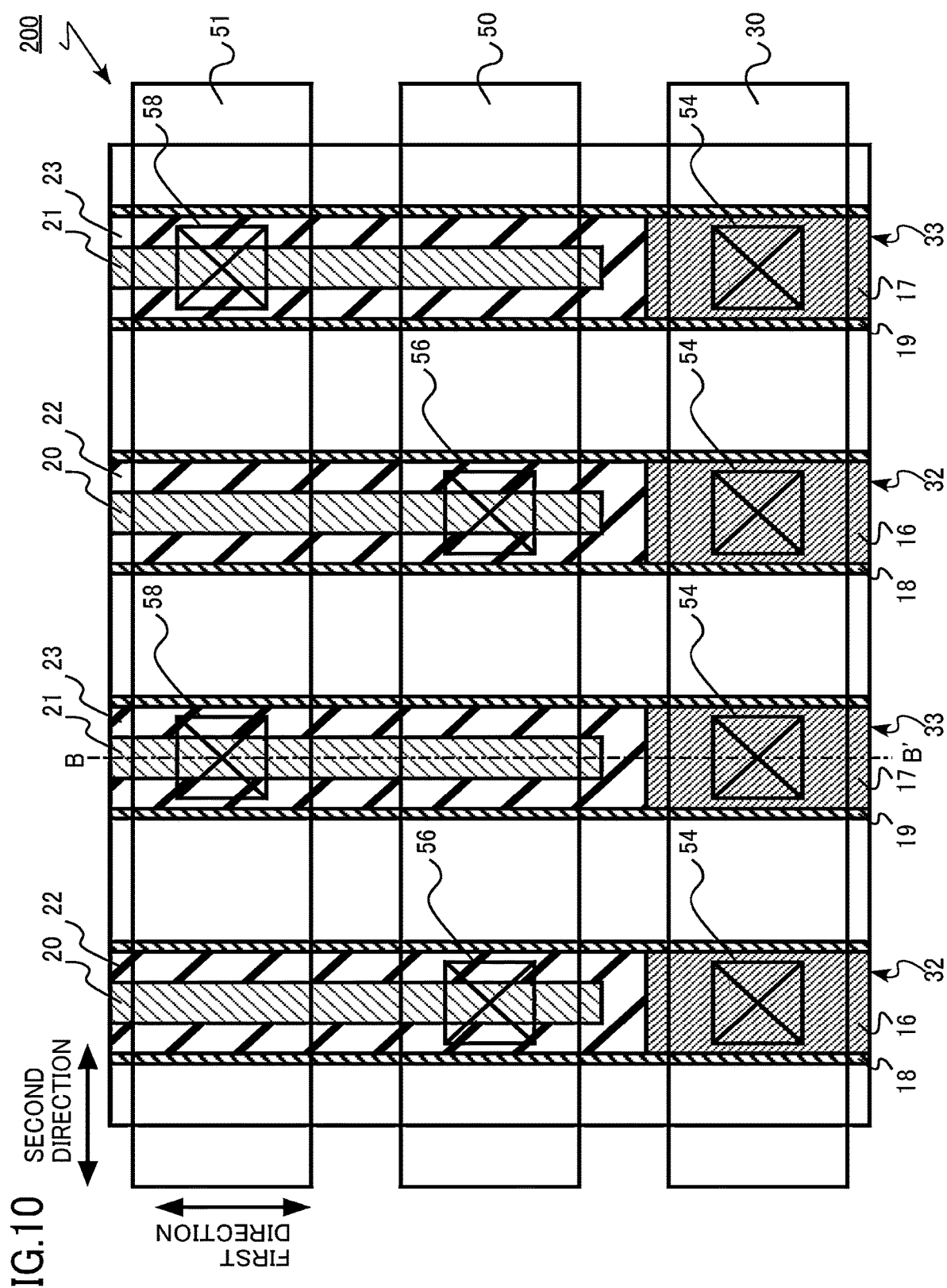
FIG. 10 is a schematic plan view of the semiconductor device of the second embodiment.

FIG. 10 is a schematic plan view of the semiconductor device of the second embodiment. FIG. 10 is a plan view of a first face of FIG. 8 (F1 in FIG. 8). FIG. 10 is a plan view of a part of a termination region 102 of the MOSFET 200. FIG. 10 is a plan view of a region X illustrated in FIG. 8. FIG. 10 does not illustrate the interlayer insulating layer 24 on first face F1.

Figure 11:
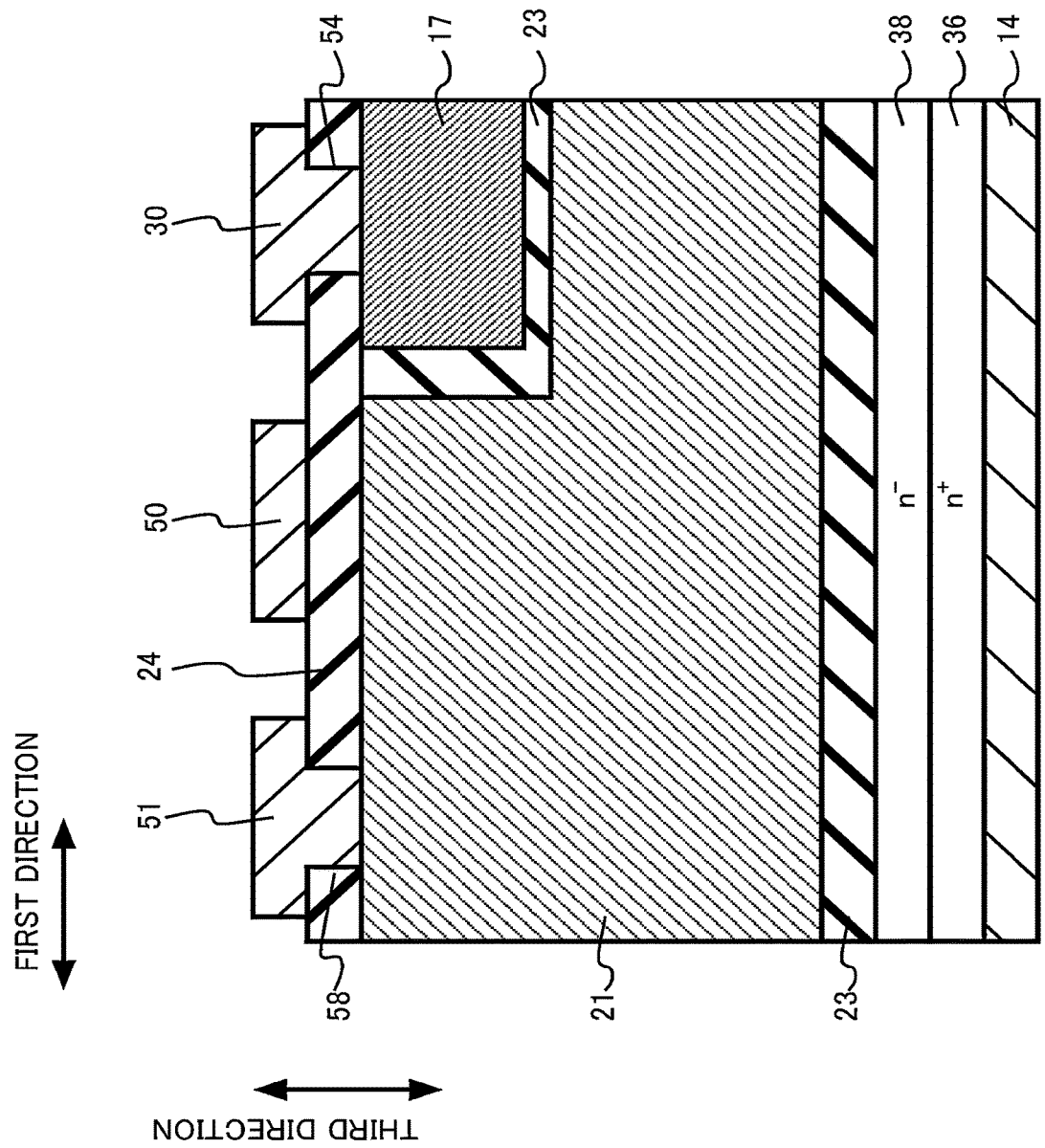
FIG. 11 is a schematic cross-sectional view of the semiconductor device of the second embodiment.

FIG. 11 is a schematic cross-sectional view of the semiconductor device of the second embodiment. FIG. 11 is a BB' cross section of FIG. 10.

The MOSFET 200 includes a silicon layer 10 (semiconductor layer), a source electrode 12 (first electrode), a drain electrode 14 (second electrode), a first gate electrode 16, a second gate electrode 17, a first gate insulating layer 18, a second gate insulating layer 19, a first field plate electrode 20, a second field plate electrode 21, a first field plate insulating layer 22, a second field plate insulating layer 23, an interlayer insulating layer 24, a gate electrode pad 28, a gate wire 30, a first field plate wire 50 (first wire), a second field plate wire 51 (second wire), a gate contact 54, a first field plate contact 56, a second field plate contact 58, and an electric resistance layer 60.

The silicon layer 10 includes a first trench 32, a second trench 33, a drain region 36 of an $n^+$ type, a drift region 38 (first semiconductor region) of an $n^-$ type, a body region 40 (second semiconductor region) of a p type, a source region 42 (third semiconductor region) of an $n^+$ type, and a contact region 44 of a $p^1$ type.

The silicon layer 10 is an example of the semiconductor layer. The source electrode 12 is an example of the first electrode. The drain electrode 14 is an example of the second electrode. The first field plate wire 50 is an example of the first wire. The second field plate wire 51 is an example of the second wire.

The drift region 38 is an example of the first semiconductor region. The body region 40 is an example of the second semiconductor region. The source region 42 is an example of the third semiconductor region.

As illustrated in FIG. 9, the first gate electrode 16 of the MOSFET 200 is not divided. The second gate electrode 17 of the MOSFET 200 is not divided.

As illustrated in FIG. 9, the MOSFET 200 does not include the first connection 26. The source electrode 12 and the first field plate electrode 20 are not electrically connected in the active region 101.

As illustrated in FIG. 9, the MOSFET 200 does not include the second connection 27. The source electrode 12 and the second field plate electrode 21 are not electrically connected in the active region 101.

The gate wire 30 is provided in the termination region of the MOSFET 200 as illustrated in FIG. 8. The gate wire 30 is electrically connected to the first gate electrode 16 and the second gate electrode 17. The gate electrode pad 28 is electrically connected to the first gate electrode 16 and the second gate electrode 17 by using the gate wire 30.

The gate wire 30 extends in the second direction in the region X. The gate wire 30 intersects with the first trench 32. The gate wire 30 intersects with the second trench 33.

The gate wire 30 is electrically connected to the first gate electrode 16 at the gate contact 54. The gate wire 30 is electrically connected to the second gate electrode 17 at the gate contact 54.

The gate wire 30 is a metal electrode. The gate wire 30 has a stacked structure of titanium (Ti) and aluminum (Al), for example. The material of the gate wire 30 is the same as the material of the source electrode 12 and the material of the gate electrode pad 28, for example.

The first field plate wire 50 is provided in the termination region of the MOSFET 200 as illustrated in FIG. 8.

The first field plate wire 50 extends in the second direction in the region X. The first field plate wire 50 intersects with the first trench 32. The gate wire 30 intersects with the second trench 33.

The first field plate wire 50 is electrically connected to the first field plate electrode 20 at the first field plate contact 56.

The first field plate wire 50 is electrically connected to the source electrode 12. The first field plate wire 50 is electrically connected between the source electrode 12 and the first field plate electrode 20. The source electrode 12 and the first field plate electrode 20 are electrically connected by using the first field plate wire 50.

The first field plate wire 50 is, for example, metal. The first field plate wire 50 has a stacked structure of titanium (Ti) and aluminum (Al), for example. The material of the first field plate wire 50 is the same as the materials of the source electrode 12 and the gate wire 30, for example. The electric resistivity of the material of the first field plate wire 50 is the same as the electric resistivity of the materials of the source electrode 12 and the gate wire 30, for example.

The second field plate wire 51 is provided in the termination region of the MOSFET 200 as illustrated in FIG. 8.

The second field plate wire 51 extends in the second direction in the region X. The second field plate wire 51 intersects with the first trench 32. The gate wire 30 intersects with the second trench 33.

The second field plate wire 51 is electrically connected to the second field plate electrode 21 at the second field plate contact 58.

The second field plate wire 51 is electrically connected to the source electrode 12. The second field plate wire 51 is electrically connected between the source electrode 12 and the second field plate electrode 21. The source electrode 12 and the second field plate electrode 21 are electrically connected by using the second field plate wire 51.

The second field plate wire 51 is, for example, metal. The second field plate wire 51 has a stacked structure of titanium (Ti) and aluminum (Al), for example. The material of the second field plate wire 51 is the same as the materials of the source electrode 12, the gate wire 30, and the first field plate wire 50, for example. The electric resistivity of the material of the second field plate wire 51 is the same as the electric resistivity of the materials of the source electrode 12, the gate wire 30, and the first field plate wire 50, for example.

The electric resistance layer 60 is provided between the second field plate wire 51 and the source electrode 12. Since the electric resistance layer 60 is provided between the second field plate wire 51 and the source electrode 12, the second electric resistance between the second field plate wire 51 and the source electrode 12 is different from the first electric resistance between the first field plate wire 50 and the source electrode 12. For example, since the electric resistance layer 60 has high resistance, the second electric resistance between the second field plate wire 51 and the source electrode 12 is higher than the first electric resistance between the first field plate wire 50 and the source electrode 12.

The electric resistance layer 60 contains, for example, tungsten (W), titanium (Ti), tantalum (Ta), or silicon (Si). The electric resistance layer 60 is, for example, tungsten (W), titanium (Ti), a titanium nitride, or polycrystalline silicon.

The material of the electric resistance layer 60 is different from the materials of the source electrode 12, the first field plate wire 50, and the second field plate wire 51, for example. The electric resistivity of the material of the electric resistance layer 60 is different from the electric resistivity of the materials of the source electrode 12, the first field plate wire 50, and the second field plate wire 51, for example.

The electric resistivity of the material of the electric resistance layer 60 is higher than the electric resistivity of the materials of the source electrode 12, the first field plate wire 50, and the second field plate wire 51, for example.

The materials of the source electrode 12, the first field plate wire 50, and the second field plate wire 51 are, for example, aluminum. The material of the electric resistance layer 60 is, for example, tungsten having an electric resistivity higher than that of aluminum. This combination allows the second electric resistance between the second field plate wire 51 and the source electrode 12 to be higher than the first electric resistance between the first field plate wire 50 and the source electrode 12.

In the above combination, for example, by making the electric resistance layer 60 fine-wire, thin-film, or long-length, it is possible to further increase the electric resistance of the electric resistance layer 60, and it is possible to cause the second electric resistance to be higher than the first electric resistance.

As described above, according to the second embodiment, it is possible to achieve a MOSFET that can improve the trade-off between the switching loss and the surge voltage.

Third Embodiment

A semiconductor device of the third embodiment is different from the semiconductor device of the second embodiment in that the material of the first wire and the material of the second wire are different. Hereinafter, part of description of the contents overlapping the first embodiment or the second embodiment may be omitted.

The semiconductor device of the third embodiment is a vertical transistor embedded with a gate electrode and a field plate electrode a trench. The semiconductor device of the third embodiment is a vertical power MOSFET. The semiconductor device of the third embodiment is a MOSFET 300.

Figure 12:
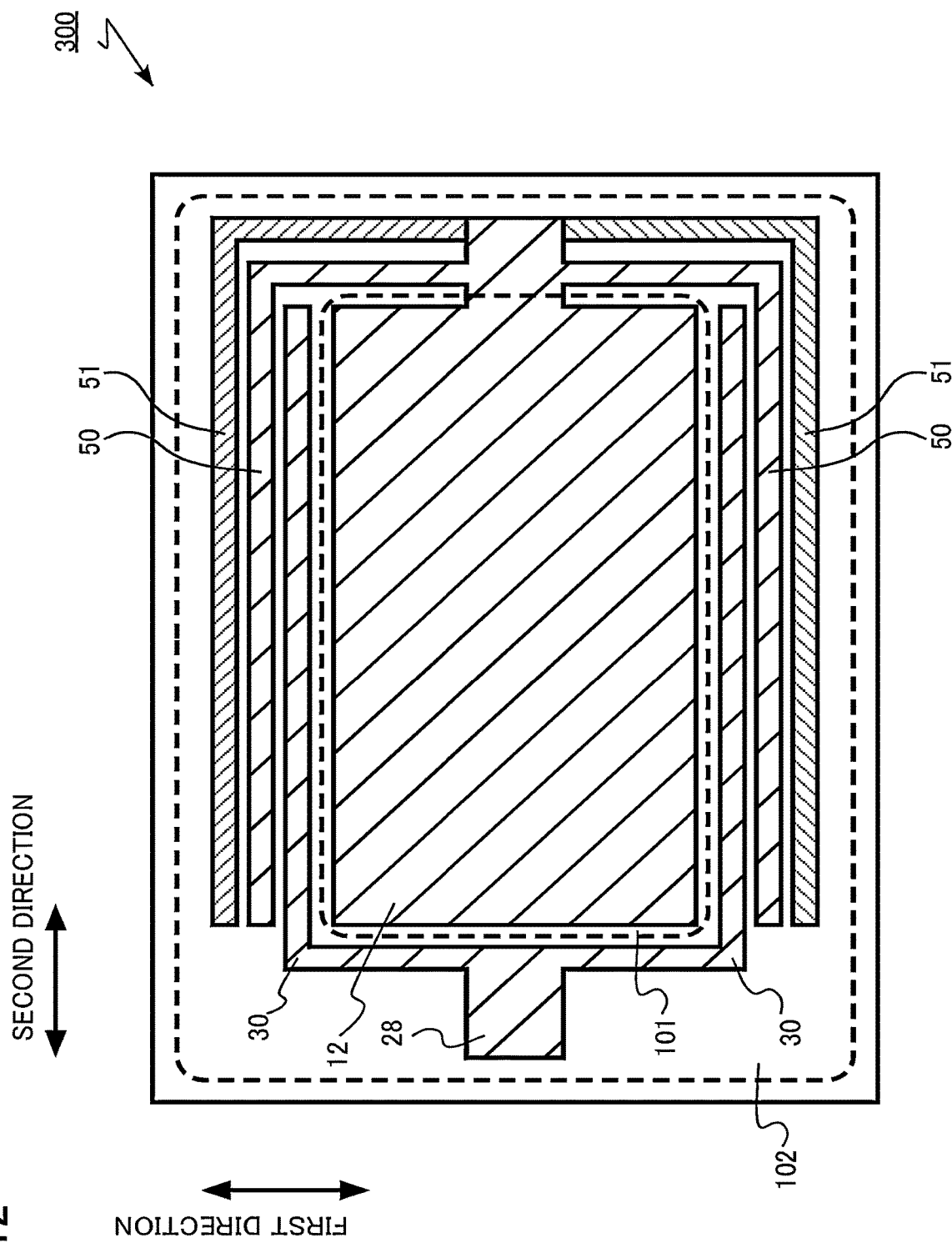
FIG. 12 is a schematic plan view of a semiconductor device of a third embodiment.

FIG. 12 is a schematic plan view of the semiconductor device of the third embodiment. FIG. 12 is a view corresponding to FIG. 8 of the MOSFET 200 of the second embodiment.

The first field plate wire 50 is provided in the termination region of the MOSFET 300 as illustrated in FIG. 12.

The first field plate wire 50 is electrically connected to the source electrode 12. The source electrode 12 and the first field plate electrode 20 are electrically connected by using the first field plate wire 50.

The first field plate wire 50 is a conductor. The first field plate wire 50 is, for example, metal, a metal nitride, metal carbide, a metal semiconductor compound, or a semiconductor.

The material of the first field plate wire 50 is the same as the materials of the source electrode 12 and the gate wire 30, for example. The electric resistivity of the material of the first field plate wire 50 is the same as the electric resistivity of the materials of the source electrode 12 and the gate wire 30, for example.

The material of the first field plate wire 50 is different from the materials of the source electrode 12 and the gate wire 30, for example. The electric resistivity of the material of the first field plate wire 50 is different from the electric resistivity of the materials of the source electrode 12 and the gate wire 30, for example.

The second field plate wire 51 is provided in the termination region of the MOSFET 200 as illustrated in FIG. 12.

The second field plate wire 51 is electrically connected to the source electrode 12. The source electrode 12 and the second field plate electrode 21 are electrically connected by using the second field plate wire 51.

The second field plate wire 51 is a conductor. The first field plate wire 50 is, for example, metal, a metal nitride, metal carbide, a metal semiconductor compound, or a semi-conductor.

The material of the second field plate wire 51 is the same as the materials of the source electrode 12 and the gate wire 30, for example. The electric resistivity of the material of the second field plate wire 51 is the same as the electric resistivity of the materials of the source electrode 12 and the gate wire 30, for example.

The material of the second field plate wire 51 is different from the materials of the source electrode 12 and the gate wire 30, for example. The electric resistivity of the material of the second field plate wire 51 is different from the electric resistivity of the materials of the source electrode 12 and the gate wire 30, for example.

The material of the second field plate wire 51 is different from the material of the first field plate wire 50. The electric resistivity of the material of the second field plate wire 51 is different from the electric resistivity of the material of the first field plate wire 50.

Since the material of the second field plate wire 51 is different from the material of the first field plate wire 50, the second electric resistance between the second field plate wire 51 and the source electrode 12 is different from the first electric resistance between the first field plate wire 50 and the source electrode 12. Since the electric resistivity of the material of the second field plate wire 51 is different from the electric resistivity of the material of the first field plate wire 50, the second electric resistance between the second field plate wire 51 and the source electrode 12 is different from the first electric resistance between the first field plate wire 50 and the source electrode 12.

For example, the material of the first field plate wire 50 is aluminum, and the material of the second field plate wire 51 is polycrystalline silicon having an electric resistivity higher than that of aluminum. This combination allows the electric resistance of the second field plate wire 51 to be higher than that of the first field plate wire 50. Therefore, the second electric resistance between the second field plate wire 51 and the source electrode 12 can be made higher than the first electric resistance between the first field plate wire 50 and the source electrode 12.

For example, the material of the first field plate wire 50 is aluminum, and the material of the second field plate wire 51 is polycrystalline silicon having an electric resistivity lower than that of aluminum. This combination allows the electric resistance of the second field plate wire 51 to be lower than that of the first field plate wire 50. Therefore, the second electric resistance between the second field plate wire 51 and the source electrode 12 can be made lower than the first electric resistance between the first field plate wire 50 and the source electrode 12.

As described above, according to the third embodiment, it is possible to achieve a MOSFET that can improve the trade-off between the switching loss and the surge voltage.

Fourth Embodiment

A semiconductor device of the fourth embodiment includes: a semiconductor layer including a first face and a second face opposing the first face, the semiconductor layer including a first trench disposed on a side of the first face, a second trench disposed on a side of the first face, a third trench disposed on a side of the first face, a first semiconductor region of a first conductivity type, a second semiconductor region of a second conductivity type disposed between the first semiconductor region and the first face, and a third semiconductor region of a first conductivity type disposed between the second semiconductor region and the first face; a first electrode disposed on a side of the first face of the semiconductor layer and electrically connected to the third semiconductor region; a second electrode disposed on a side of the second face of the semiconductor layer; a first field plate electrode disposed in the first trench, and electrically connected to the first electrode, the first field plate electrode whose electric resistance with the first electrode is a first electric resistance; a second field plate electrode disposed in the second trench, and electrically connected to the first electrode, the second field plate electrode whose electric resistance with the first electrode is a second electric resistance different from the first electric resistance; a gate electrode disposed in the third trench; a first field plate insulating layer disposed between the first field plate electrode and the semiconductor layer; a second field plate insulating layer disposed between the second field plate electrode and the semiconductor layer; and a gate insulating layer disposed between the gate electrode and the semiconductor layer. A semiconductor device of the fourth embodiment is different from the semiconductor device of the first embodiment in that the gate electrode is not disposed in the first trench and the second trench but is disposed in the third trench. Hereinafter, part of description of the contents overlapping the first embodiment may be omitted.

The semiconductor device of the fourth embodiment is a vertical transistor embedded with a gate electrode and a field plate electrode a trench. The semiconductor device of the fourth embodiment is a vertical power MOSFET. The semiconductor device of the fourth embodiment is a MOSFET 400.

Figure 13:
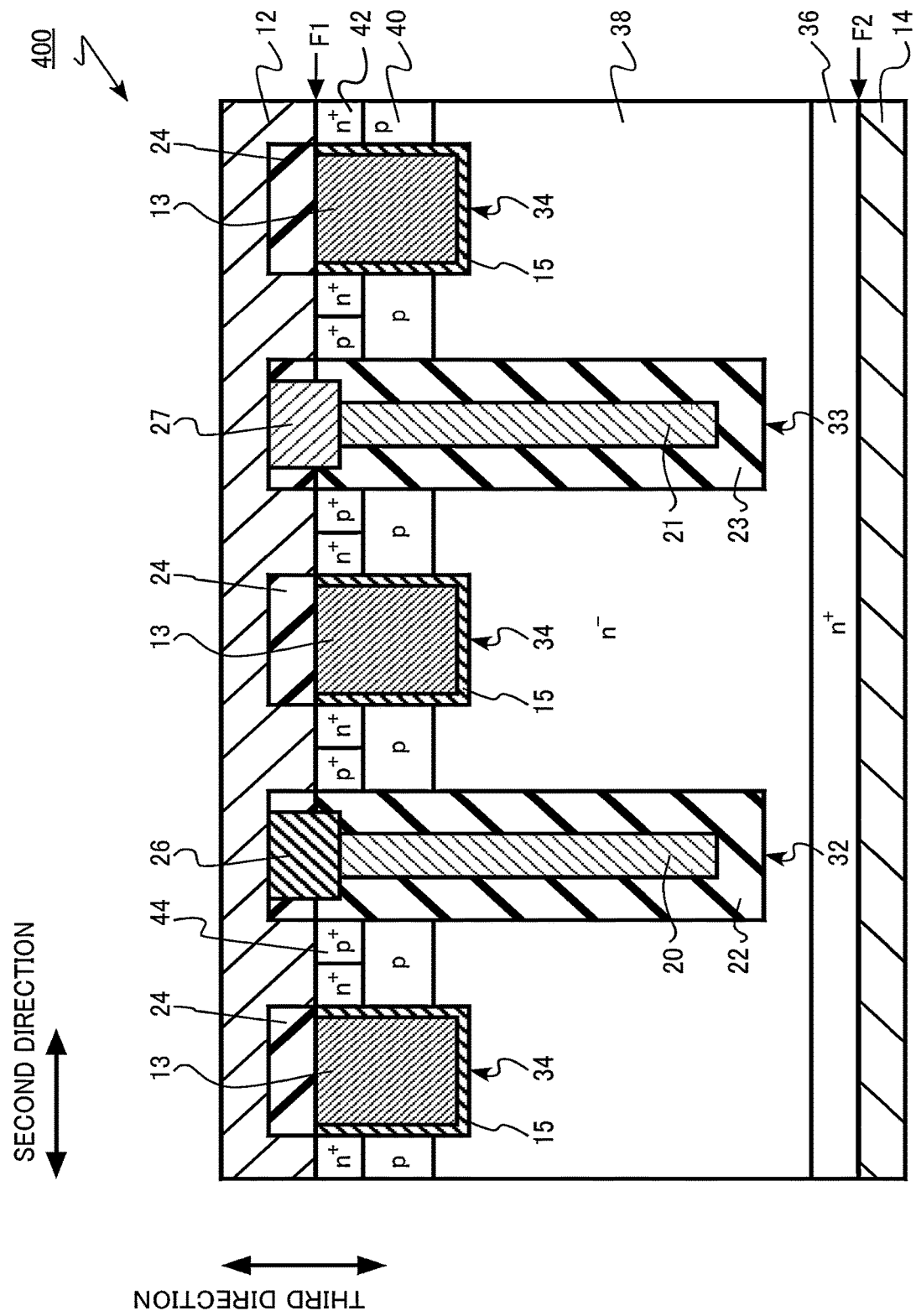
FIG. 13 is a schematic cross-sectional view of a semiconductor device of a fourth embodiment.
Figure 14:
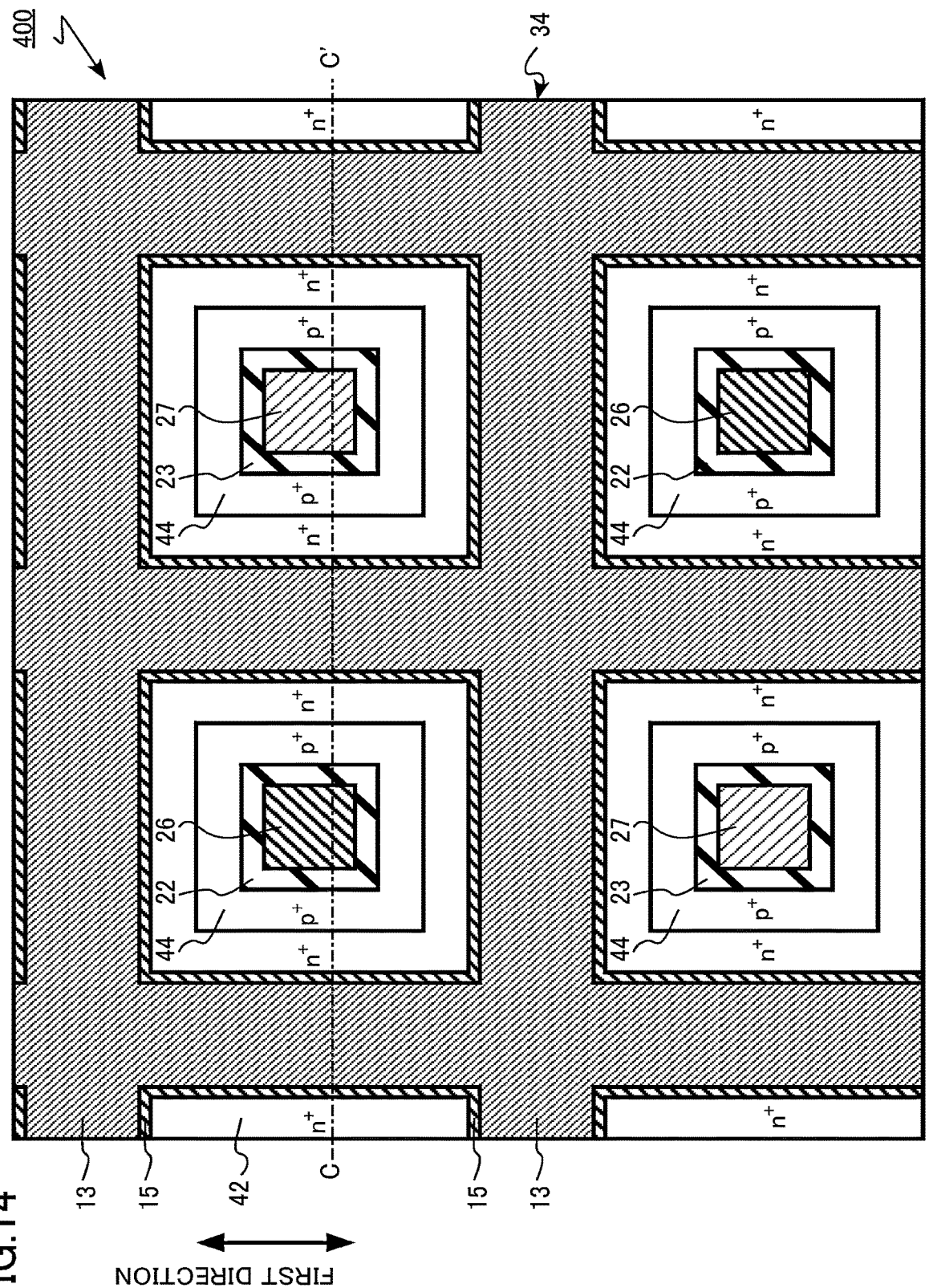
FIG. 14 is a schematic plan view of the semiconductor device of the fourth embodiment.

FIG. 13 is a schematic cross-sectional view of the semiconductor device of the fourth embodiment. FIG. 14 is a schematic plan view of the semiconductor device of the fourth embodiment. FIG. 14 is a plan view of a first face of FIG. 13 (F1 in FIG. 13). FIG. 13 is a CC' cross section of FIG. 14. FIGS. 13 and 14 are views illustrating part of the active region of the MOSFET 400.

The MOSFET 400 includes a silicon layer 10 (semiconductor layer), a source electrode 12 (first electrode), a drain electrode 14 (second electrode), a gate electrode 13, a gate insulating layer 15, a first field plate electrode 20, a second field plate electrode 21, a first field plate insulating layer 22, a second field plate insulating layer 23, an interlayer insulating layer 24, a first connection 26, and a second connection 27.

The silicon layer 10 includes a first trench 32, a second trench 33, a third trench 34, a drain region 36 of an $n^+$ type, a drift region 38 (first semiconductor region) of an $n^-$ type, a body region 40 (second semiconductor region) of a p type, a source region 42 (third semiconductor region) of an $n^+$ type, and a contact region 44 of a $p^+$ type.

The silicon layer 10 is an example of the semiconductor layer. The source electrode 12 is an example of the first electrode. The drain electrode 14 is an example of the second electrode.

The drift region 38 is an example of the first semiconductor region. The body region 40 is an example of the second semiconductor region. The source region 42 is an example of the third semiconductor region.

The first trench 32 is present in the silicon layer 10. The first trench 32 is disposed on the side of the first face F1 of the silicon layer 10. The first trench 32 is a groove formed in the silicon layer 10.

The second trench 33 is present in the silicon layer 10. The second trench 33 is disposed on the side of the first face F1 of the silicon layer 10. The second trench 33 is a groove formed in the silicon layer 10.

As illustrated in FIG. 14, the first trench 32 and the second trench 33 are provided in a dot shape on the first face F1.

The third trench 34 is present in the silicon layer 10. The third trench 34 is disposed on the side of the first face F1 of the silicon layer 10. The third trench 34 is a groove formed in the silicon layer 10.

The third trench 34 surrounds the first trench 32. The third trench 34 surrounds the second trench 33. The third trench 34 has a mesh shape on the first face F1.

The third trench 34 is shallower than the first trench 32. The third trench 34 is shallower than the second trench 33.

The gate electrode 13 is provided in the third trench 34. The gate insulating layer 15 is provided between the gate electrode 13 and the silicon layer 10.

The first field plate electrode 20 is provided in the first trench 32.

The first field plate electrode 20 is electrically connected to the source electrode 12. Hereinafter, the electric resistance between the source electrode 12 and the first field plate electrode 20 is referred to as the first electric resistance. Hereinafter, the electric resistance value between the source electrode 12 and the first field plate electrode 20 is referred to as the first electric resistance.

The first field plate electrode 20 is a conductor. The first field plate electrode 20 is, for example, polycrystalline silicon containing the n type impurity or the p type impurity.

The second field plate electrode 21 is provided in the second trench 33.

The second field plate electrode 21 is electrically connected to the source electrode 12. Hereinafter, the electric resistance between the source electrode 12 and the second field plate electrode 21 is referred to as the second electric resistance. Hereinafter, the electric resistance value between the source electrode 12 and the second field plate electrode 21 is referred to as the second electric resistance.

The second electric resistance is different from the first electric resistance. The electric resistance value between the source electrode 12 and the second field plate electrode 21 is different from the electric resistance value between the source electrode 12 and the first field plate electrode 20.

The value of the first electric resistance and the value of the second electric resistance are different, for example, by equal to or more than one digit. For example, the second electric resistance is equal to or more than 10 times the first electric resistance. For example, the first electric resistance is equal to or more than 10 times the second electric resistance.

The second field plate electrode 21 is a conductor. The second field plate electrode 21 is, for example, polycrystalline silicon containing the n type impurity or the p type impurity. The second field plate electrode 21 is formed of, for example, the same material as that of the first field plate electrode 20.

The first field plate insulating layer 22 is provided between the first field plate electrode 20 and the silicon layer 10. The first field plate insulating layer 22 is provided between the first field plate electrode 20 and the drift region 38. The first field plate insulating layer 22 is, for example, a silicon oxide.

The second field plate insulating layer 23 is provided between the second field plate electrode 21 and the silicon layer 10. The second field plate insulating layer 23 is provided between the second field plate electrode 21 and the drift region 38. The second field plate insulating layer 23 is, for example, a silicon oxide.

The first connection 26 is provided between the source electrode 12 and the first field plate electrode 20. The first connection 26 electrically connects the source electrode 12 and the first field plate electrode 20.

The electric resistance value of the first connection 26 is, for example, the first electric resistance.

The first connection 26 is a conductor. The first connection 26 is, for example, metal, a metal nitride, metal carbide, a metal semiconductor compound, or a semiconductor.

The first connection 26 contains, for example, tungsten (W), aluminum (Al), titanium (Ti), tantalum (Ta), copper (Cu), or silicon (Si).

The first connection 26 is, for example, tungsten (W), aluminum (Al), titanium (Ti), a titanium nitride, or polycrystalline silicon.

The first connection 26 is made of, for example, a material different from that of the source electrode 12. The electric resistivity of the material of the first connection 26 is different from, for example, the electric resistivity of the material of the source electrode 12.

The first connection 26 is made of, for example, the same material as that of the source electrode 12.

The first connection 26 is made of, for example, a material different from that of the first field plate electrode 20. The electric resistivity of the material of the first connection 26 is different from, for example, the electric resistivity of the material of the first field plate electrode 20.

The first connection 26 is made of, for example, the same material as that of the first field plate electrode 20.

The second connection 27 is provided between the source electrode 12 and the second field plate electrode 21. The second connection 27 electrically connects the source electrode 12 and the second field plate electrode 21.

The electric resistance of the second connection 27 is different from the electric resistance of the first connection 26. The electric resistance value of the second connection 27 is, for example, the second electric resistance. The second electric resistance is different from the first electric resistance.

The value of the electric resistance of the first connection 26 and the value of the electric resistance of the second connection 27 are different, for example, by equal to or more than one digit. For example, the electric resistance of the second connection 27 is equal to or more than 10 times the electric resistance of the first connection 26. For example, the electric resistance of the first connection 26 is equal to or more than 10 times the electric resistance of the second connection 27.

The second connection 27 is a conductor. The second connection 27 is, for example, metal, a metal nitride, metal carbide, a metal semiconductor compound, or a semiconductor.

The second connection 27 contains, for example, tungsten (W), aluminum (Al), titanium (Ti), tantalum (Ta), copper (Cu), or silicon (Si).

The second connection 27 is, for example, tungsten (W), aluminum (Al), titanium (Ti), a titanium nitride, or polycrystalline silicon.

The second connection 27 is made of, for example, a material different from that of the source electrode 12. The electric resistivity of the material of the second connection 27 is different from, for example, the electric resistivity of the material of the source electrode 12.

The second connection 27 is made of, for example, the same material as that of the source electrode 12.

The second connection 27 is made of, for example, a material different from that of the second field plate electrode 21. The electric resistivity of the material of the second connection 27 is different from, for example, the electric resistivity of the material of the second field plate electrode 21.

The second connection 27 is made of, for example, the same material as that of the second field plate electrode 21.

The second connection 27 is made of, for example, a material different from that of the first connection 26. The electric resistivity of the material of the second connection 27 is different from, for example, the electric resistivity of the material of the first connection 26.

The second connection 27 is made of, for example, the same material as that of the first connection 26. For example, even if the material of the first connection 26 and the material of the second connection 27 are the same, the electric resistance of the second connection 27 can be made different from the electric resistance of the first connection 26 by changing the shape.

The first connection 26 or the second connection 27 may be a part of the source electrode 12 formed simultaneously with the source electrode 12.

The interlayer insulating layer 24 is provided between the gate electrode 13 and the source electrode 12.

The source electrode 12 is provided on the side of the first face F1 of the silicon layer 10. The source electrode 12 is provided on the first face F1 of the silicon layer 10.

The source electrode 12 is electrically connected to the first field plate electrode 20 by using the first connection 26. The source electrode 12 is electrically connected to the second field plate electrode 21 by using the second connection 27.

The source electrode 12 is a metal electrode. The source electrode 12 has a stacked structure of titanium (Ti) and aluminum (Al), for example.

The drain electrode 14 is provided on the side of the second face F2 of the silicon layer 10. The drain electrode 14 is provided on the second face F2 of the silicon layer 10.

The drain electrode 14 is a metal electrode. The drain electrode 14 has a stacked structure of a material selected from titanium (Ti), aluminum (Al), nickel (Ni), copper (Cu), silver (Ag), and gold (Au), for example.

In the MOSFET 400 of the fourth embodiment, the second electric resistance between the source electrode 12 and the second field plate electrode 21 is different from the first electric resistance between the source electrode 12 and the first field plate electrode 20. Therefore, according to the MOSFET 400 of the fourth embodiment, it is possible to improve the trade-off between the switching loss and the surge voltage.

In the MOSFET 400 of the fourth embodiment, from the viewpoint of improving the trade-off between the switching loss and the surge voltage, the value of the first electric resistance and the value of the second electric resistance are preferably different by equal to or more than one digit, and more preferably different by equal to or more than two digits. For example, the first electric resistance is preferably equal to or more than 10 times, more preferably equal to or more than 50 times, and yet more preferably equal to or more than 100 times the second electric resistance. For example, the second electric resistance is preferably equal to or more than 10 times, more preferably equal to or more than 50 times, and yet more preferably equal to or more than 100 times the first electric resistance.

In the MOSFET 400 of the fourth embodiment, from the viewpoint of improving the trade-off between the switching loss and the surge voltage, the value of the electric resistance of the first connection 26 and the value of the electric resistance of the second connection 27 are preferably different by equal to or more than one digit, and more preferably different by equal to or more than two digits. For example, the electric resistance of the second connection 27 is preferably equal to or more than 10 times, more preferably equal to or more than 50 times, and yet more preferably equal to or more than 100 times the electric resistance of the first connection 26. For example, the electric resistance of the first connection 26 is preferably equal to or more than 10 times, more preferably equal to or more than 50 times, and yet more preferably equal to or more than 100 times the electric resistance of the second connection 27.

Note that FIGS. 13 and 14 illustrate the case where the third trench 34 has a quadrangular mesh shape, but the third trench 34 may have another polygonal mesh shape such as a hexagonal mesh shape or an octagonal mesh shape.

As described above, according to the fourth embodiment, it is possible to achieve a MOSFET that can improve the trade-off between the switching loss and the surge voltage.

As described above, in the first to fourth embodiments, the case where the first conductivity type is the n type and the second conductivity type is the p type has been described as an example, but the first conductivity type may be the p type and the second conductivity type may be the n type.

In the first to fourth embodiments, silicon has been described as an example of the semiconductor material, but other semiconductor materials such as silicon carbide (SiC) and gallium nitride (GaN) can also be used.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer including a first face and a second face opposing the first face,
the semiconductor layer including
a first trench disposed on a side of the first face and extending in a first direction parallel to the first face,
a second trench disposed on a side of the first face and extending in the first direction,
a first semiconductor region of a first conductivity type,
a second semiconductor region of a second conductivity type disposed between the first semiconductor region and the first face, and
a third semiconductor region of a first conductivity type disposed between the second semiconductor region and the first face;
a first electrode disposed on a side of the first face of the semiconductor layer and electrically connected to the third semiconductor region;
a second electrode disposed on a side of the second face of the semiconductor layer;
a first gate electrode disposed in the first trench;
a first field plate electrode disposed in the first trench, the first field plate electrode disposed between the first gate electrode and the second face, the first field plate electrode electrically connected to the first electrode, an electric resistance between the first electrode and the first field plate electrode is a first electric resistance;
a second gate electrode disposed in the second trench;
a second field plate electrode disposed in the second trench, the second field plate disposed between the second gate electrode and the second face, the second field plate electrically connected to the first electrode, an electric resistance between the first electrode and the second field plate electrode is a second electric resistance different from the first electric resistance;
a first gate insulating layer disposed between the first gate electrode and the semiconductor layer;
a first field plate insulating layer disposed between the first field plate electrode and the semiconductor layer;
a second gate insulating layer disposed between the second gate electrode and the semiconductor layer; and a second field plate insulating layer disposed between the second field plate electrode and the semiconductor layer.

2. The semiconductor device according to claim 1, wherein a value of the first electric resistance and a value of the second electric resistance are different by equal to or more than one digit.

3. The semiconductor device according to claim 1, further comprising:
a first connection disposed between the first electrode and the first field plate electrode and electrically connecting the first electrode and the first field plate electrode; and
a second connection disposed between the first electrode and the second field plate electrode, the second connection electrically connecting the first electrode and the second field plate electrode, and the second connection different from the first connection in electric resistance.

4. The semiconductor device according to claim 3, wherein a material of the first connection and a material of the second connection are different.

5. The semiconductor device according to claim 1, further comprising:
a first wire extending in a direction intersecting the first trench and electrically connected between the first field plate electrode and the first electrode; and
a second wire extending in a direction intersecting the second trench and electrically connected between the second field plate electrode and the first electrode.

6. The semiconductor device according to claim 5, further comprising an electric resistance layer provided either between the first wire and the first electrode or between the second wire and the first electrode.

7. The semiconductor device according to claim 6, wherein a material of the electric resistance layer is different from a material of the first electrode, a material of the first wire, and a material of the second wire.

8. The semiconductor device according to claim 5, wherein a material of the first wire and a material of the second wire are different.

9. A semiconductor device comprising:
a semiconductor layer including a first face and a second face opposing the first face, the semiconductor layer including
a first trench disposed on a side of the first face,
a second trench disposed on a side of the first face,
a third trench disposed on a side of the first face,
a first semiconductor region of a first conductivity type,
a second semiconductor region of a second conductivity type disposed between the first semiconductor region and the first face, and
a third semiconductor region of a first conductivity type disposed between the second semiconductor region and the first face;
a first electrode disposed on a side of the first face of the semiconductor layer and electrically connected to the third semiconductor region;
a second electrode disposed on a side of the second face of the semiconductor layer;
a first field plate electrode disposed in the first trench, the first field plate electrically connected to the first electrode, an electric resistance between the first electrode and the first field plate electrode is a first electric resistance;
a second field plate electrode disposed in the second trench, the second field plate electrode electrically connected to the first electrode, an electric resistance between the first electrode and the second field plate electrode is a second electric resistance different from the first electric resistance;
a gate electrode disposed in the third trench;
a first field plate insulating layer disposed between the first field plate electrode and the semiconductor layer;
a second field plate insulating layer disposed between the second field plate electrode and the semiconductor layer; and
a gate insulating layer disposed between the gate electrode and the semiconductor layer.

10. The semiconductor device according to claim 9, wherein a value of the first electric resistance and a value of the second electric resistance are different by equal to or more than one digit.

11. The semiconductor device according to claim 9, further comprising:
a first connection disposed between the first electrode and the first field plate electrode and electrically connecting the first electrode and the first field plate electrode; and
a second connection disposed between the first electrode and the second field plate electrode and electrically connecting the first electrode and the second field plate electrode.

12. The semiconductor device according to claim 11, wherein a material of the first connection and a material of the second connection are different.

13. The semiconductor device according to claim 9, wherein the third trench surrounds the first trench, and the third trench surrounds the second trench.

* * * * *